US010301738B2

(12) United States Patent
Buckalew et al.

(10) Patent No.: US 10,301,738 B2
(45) Date of Patent: May 28, 2019

(54) METHODS AND APPARATUS FOR WETTING PRETREATMENT FOR THROUGH RESIST METAL PLATING

(71) Applicant: Novellus Systems, Inc., Fremont, CA (US)

(72) Inventors: Bryan L. Buckalew, Tualatin, OR (US); Steven T. Mayer, Aurora, OR (US); Thomas A. Ponnuswamy, Sherwood, OR (US); Robert Rash, West Linn, OR (US); Brian Paul Blackman, Newberg, OR (US); Doug Higley, Portland, OR (US)

(73) Assignee: Novellus Systems, Inc., Fremont, CA (US)

( * ) Notice: Subject to any disclaimer, the term of this patent is extended or adjusted under 35 U.S.C. 154(b) by 52 days.

(21) Appl. No.: 15/724,120

(22) Filed: Oct. 3, 2017

(65) Prior Publication Data
US 2018/0023209 A1 Jan. 25, 2018

Related U.S. Application Data

(60) Division of application No. 15/181,150, filed on Jun. 13, 2016, now Pat. No. 9,828,688, which is a
(Continued)

(51) Int. Cl.
*C25D 3/12* (2006.01)
*C25D 3/30* (2006.01)
(Continued)

(52) U.S. Cl.
CPC ............ *C25D 7/123* (2013.01); *C25D 3/12* (2013.01); *C25D 3/30* (2013.01); *C25D 5/00* (2013.01);
(Continued)

(58) Field of Classification Search
CPC ... C25D 3/12; C25D 3/30; C25D 3/38; C25D 5/00; C25D 5/003; C25D 5/022;
(Continued)

(56) References Cited

U.S. PATENT DOCUMENTS 1,255,395 A 2/1918 Duram
3,360,248 A 12/1967 Lindeman et al.
(Continued)

FOREIGN PATENT DOCUMENTS

CN 101504911 A 8/2009
CN 102286760 A 12/2011
(Continued)

OTHER PUBLICATIONS

U.S. Office Action, dated Sep. 19, 2016, issued in U.S. Appl. No. 14/102,239.
(Continued)

*Primary Examiner* — Louis J Rufo
(74) *Attorney, Agent, or Firm* — Weaver Austin Villeneuve & Sampson LLP

(57) ABSTRACT

Disclosed are pre-wetting apparatus designs and methods. In some embodiments, a pre-wetting apparatus includes a degasser, a process chamber, and a controller. The process chamber includes a wafer holder configured to hold a wafer substrate, a vacuum port configured to allow formation of a subatmospheric pressure in the process chamber, and a fluid inlet coupled to the degasser and configured to deliver a degassed pre-wetting fluid onto the wafer substrate at a velocity of at least about 7 meters per second whereby particles on the wafer substrate are dislodged and at a flow rate whereby dislodged particles are removed from the wafer substrate. The controller includes program instructions for forming a wetting layer on the wafer substrate in the process chamber by contacting the wafer substrate with the degassed
(Continued)

pre-wetting fluid admitted through the fluid inlet at a flow rate of at least about 0.4 liters per minute.

20 Claims, 16 Drawing Sheets

Related U.S. Application Data continuation of application No. 13/775,987, filed on Feb. 25, 2013, now Pat. No. 9,455,139, which is a continuation-in-part of application No. 12/684,792, filed on Jan. 8, 2010, now abandoned.

(60) Provisional application No. 61/610,316, filed on Mar. 13, 2012, provisional application No. 61/218,024, filed on Jun. 17, 2009.

(51) Int. Cl.
| | |
|---|---|
| *C25D 3/38* | (2006.01) |
| *C25D 5/00* | (2006.01) |
| *C25D 5/02* | (2006.01) |
| *C25D 5/12* | (2006.01) |
| *C25D 5/56* | (2006.01) |
| *C25D 7/12* | (2006.01) |
| *C25D 17/00* | (2006.01) |
| *C25D 21/04* | (2006.01) |
| *C25D 21/12* | (2006.01) |
| *H01L 21/02* | (2006.01) |
| *H01L 21/67* | (2006.01) |
| *H01L 21/288* | (2006.01) |
| *H01L 21/321* | (2006.01) |
| *H01L 21/768* | (2006.01) |

(52) U.S. Cl.
CPC ............ *C25D 5/003* (2013.01); *C25D 5/022* (2013.01); *C25D 5/12* (2013.01); *C25D 5/56* (2013.01); *C25D 17/001* (2013.01); *C25D 21/04* (2013.01); *C25D 21/12* (2013.01); *H01L 21/02307* (2013.01); *H01L 21/2885* (2013.01); *H01L 21/321* (2013.01); *H01L 21/67051* (2013.01); *H01L 21/67138* (2013.01); *H01L 21/76861* (2013.01); *H01L 21/76879* (2013.01); *H01L 21/76898* (2013.01); *C25D 3/38* (2013.01); *H01L 21/76877* (2013.01); *H01L 21/76885* (2013.01)

(58) Field of Classification Search
CPC . C25D 5/12; C25D 5/56; C25D 7/123; C25D 17/001; C25D 21/04; C25D 21/21; H01L 31/02307; H01L 31/2885; H01L 31/321; H01L 31/67051; H01L 31/67138; H01L 31/76861; H01L 31/76877; H01L 31/76879; H01L 31/76885; H01L 31/76898

See application file for complete search history.

(56) References Cited

U.S. PATENT DOCUMENTS

| | | | |
|---|---|---|---|
| 3,849,002 A | 11/1974 | Hach | |
| 4,101,919 A | 7/1978 | Ammann | |
| 4,229,191 A | 10/1980 | Moore | |
| 4,297,217 A | 10/1981 | Hines et al. | |
| 4,816,081 A | 3/1989 | Mehta et al. | |
| 5,000,827 A | 3/1991 | Schuster et al. | |
| 5,221,449 A | 6/1993 | Colgan et al. | |
| 5,281,485 A | 1/1994 | Colgan et al. | |
| 5,427,674 A | 6/1995 | Langenskiold et al. | |
| 5,482,611 A | 1/1996 | Helmer et al. | |
| 5,555,234 A | 9/1996 | Sugimoto | |
| 5,800,626 A | 9/1998 | Cohen et al. | |
| 5,831,727 A | 11/1998 | Stream | |
| 5,982,762 A | 11/1999 | Anzai et al. | |
| 5,985,762 A | 11/1999 | Geffken et al. | |
| 6,004,470 A | 12/1999 | Abril | |
| 6,017,437 A | 1/2000 | Ting et al. | |
| 6,074,544 A | 6/2000 | Reid et al. | |
| 6,099,702 A | 8/2000 | Reid et al. | |
| 6,110,346 A | 8/2000 | Reid et al. | |
| 6,124,203 A | 9/2000 | Joo et al. | |
| 6,126,798 A | 10/2000 | Reid et al. | |
| 6,139,712 A | 10/2000 | Patton et al. | |
| 6,156,167 A | 12/2000 | Patton et al. | |
| 6,159,354 A | 12/2000 | Contolini et al. | |
| 6,162,344 A | 12/2000 | Reid et al. | |
| 6,179,973 B1 | 1/2001 | Lai et al. | |
| 6,179,983 B1 | 1/2001 | Reid et al. | |
| 6,193,854 B1 | 2/2001 | Lai et al. | |
| 6,193,859 B1 | 2/2001 | Contolini et al. | |
| 6,217,716 B1 | 4/2001 | Fai Lai | |
| 6,221,757 B1 | 4/2001 | Schmidbauer et al. | |
| 6,251,242 B1 | 6/2001 | Fu et al. | |
| 6,261,433 B1 | 7/2001 | Landau | |
| 6,274,008 B1 | 8/2001 | Gopalraja et al. | |
| 6,277,249 B1 | 8/2001 | Gopalraja et al. | |
| 6,333,275 B1 | 12/2001 | Feng et al. | |
| 6,413,388 B1 | 7/2002 | Uzoh et al. | |
| 6,503,376 B2 | 1/2003 | Toyoda et al. | |
| 6,540,899 B2 | 4/2003 | Keigler | |
| 6,544,585 B1 * | 4/2003 | Kuriyama | H01L 21/67144 216/18 |
| 6,551,487 B1 | 4/2003 | Reid et al. | |
| 6,582,578 B1 * | 6/2003 | Dordi | C25D 21/00 204/212 |
| 6,596,148 B1 | 7/2003 | Belongia et al. | |
| 6,689,257 B2 | 2/2004 | Mishima et al. | |
| 6,716,332 B1 | 4/2004 | Yoshioka | |
| 6,753,250 B1 | 6/2004 | Hill et al. | |
| 6,800,187 B1 | 10/2004 | Reid et al. | |
| 6,964,792 B1 | 11/2005 | Mayer et al. | |
| 7,014,679 B2 * | 3/2006 | Parekh | B01D 19/0031 205/291 |
| 7,097,410 B1 | 8/2006 | Reid et al. | |
| 7,270,734 B1 | 9/2007 | Schetty, III et al. | |
| 7,670,950 B2 | 3/2010 | Richardson et al. | |
| 7,686,927 B1 | 3/2010 | Reid et al. | |
| 7,771,662 B2 | 8/2010 | Pressman et al. | |
| 8,404,095 B2 | 3/2013 | Perkins et al. | |
| 8,795,480 B2 | 8/2014 | Mayer et al. | |
| 8,962,085 B2 | 2/2015 | Mayer et al. | |
| 9,028,666 B2 | 5/2015 | Ranjan et al. | |
| 9,138,784 B1 | 9/2015 | Hawkins et al. | |
| 9,435,049 B2 | 9/2016 | Thorum | |
| 9,455,139 B2 | 9/2016 | Buckalew et al. | |
| 9,481,942 B2 | 11/2016 | Zhou et al. | |
| 9,613,833 B2 | 4/2017 | Chua et al. | |
| 9,617,648 B2 | 4/2017 | Thorum et al. | |
| 9,677,188 B2 | 6/2017 | Stowell et al. | |
| 9,721,800 B2 | 8/2017 | Mayer et al. | |
| 2001/0035346 A1 | 11/2001 | Maeda | |
| 2002/0027080 A1 | 3/2002 | Yoshioka et al. | |
| 2002/0029973 A1 | 3/2002 | Maydan | |
| 2002/0084183 A1 | 7/2002 | Hanson et al. | |
| 2002/0084189 A1 | 7/2002 | Wang et al. | |
| 2002/0195352 A1 | 12/2002 | Mayer et al. | |
| 2003/0116439 A1 | 6/2003 | Seo et al. | |
| 2004/0084315 A1 | 5/2004 | Mizohata et al. | |
| 2004/0188257 A1 | 9/2004 | Klocke et al. | |
| 2004/0198190 A1 | 10/2004 | Basol et al. | |
| 2004/0200725 A1 | 10/2004 | Yahalom et al. | |
| 2004/0231794 A1 | 11/2004 | Hongo et al. | |
| 2004/0262165 A1 | 12/2004 | Kanda et al. | |
| 2005/0008786 A1 | 1/2005 | Dubin et al. | |
| 2005/0026455 A1 | 2/2005 | Hamada et al. | |
| 2005/0145482 A1 | 7/2005 | Suzuki et al. | |
| 2005/0255414 A1 | 11/2005 | Inabe et al. | |
| 2006/0065536 A1 | 3/2006 | Jentz et al. | |

(56) References Cited

U.S. PATENT DOCUMENTS

| | | |
|---|---|---|
| 2006/0102485 A1 | 5/2006 | Nakano et al. |
| 2006/0141157 A1 | 6/2006 | Sekimoto et al. |
| 2006/0266393 A1 | 11/2006 | Verhaverbeke et al. |
| 2007/0235343 A1 | 10/2007 | Watikowski et al. |
| 2008/0041423 A1 | 2/2008 | Hardikar et al. |
| 2008/0149487 A1 | 6/2008 | Lee |
| 2008/0200018 A1 | 8/2008 | Kawamoto |
| 2009/0151754 A1* | 6/2009 | Zhu ............... C11D 3/3723 134/26 |
| 2009/0183992 A1 | 7/2009 | Fredenberg et al. |
| 2010/0032310 A1 | 2/2010 | Reid et al. |
| 2010/0044236 A1 | 2/2010 | Mayer et al. |
| 2010/0084275 A1 | 4/2010 | Hanafusa |
| 2010/0116672 A1 | 5/2010 | Mayer et al. |
| 2010/0163078 A1 | 7/2010 | Hsu et al. |
| 2010/0200960 A1 | 8/2010 | Angyal et al. |
| 2010/0247761 A1 | 9/2010 | Hashimoto |
| 2010/0320081 A1 | 12/2010 | Mayer et al. |
| 2010/0320609 A1 | 12/2010 | Mayer et al. |
| 2011/0043239 A1 | 2/2011 | Tomita et al. |
| 2011/0284386 A1 | 11/2011 | Willey et al. |
| 2012/0175263 A1 | 7/2012 | Ganesan et al. |
| 2012/0255864 A1 | 10/2012 | Nagai et al. |
| 2012/0292192 A1 | 11/2012 | Ranjan et al. |
| 2013/0143071 A1 | 6/2013 | Kleinle |
| 2013/0171833 A1 | 7/2013 | Buckalew et al. |
| 2013/0264213 A1 | 10/2013 | Roeger-Goepfert et al. |
| 2014/0097088 A1 | 4/2014 | Stowell et al. |
| 2014/0230860 A1 | 8/2014 | Chua et al. |
| 2015/0096883 A1 | 4/2015 | Mayer et al. |
| 2015/0126030 A1 | 5/2015 | Yang et al. |
| 2015/0140814 A1 | 5/2015 | Thorum |
| 2015/0179458 A1 | 6/2015 | Mayer et al. |
| 2016/0222535 A1 | 8/2016 | Zhou et al. |
| 2016/0258078 A1 | 9/2016 | Thorum et al. |
| 2016/0281255 A1 | 9/2016 | Buckalew et al. |
| 2017/0148627 A1 | 5/2017 | Chua et al. |

FOREIGN PATENT DOCUMENTS

| | | |
|---|---|---|
| CN | 102677139 A | 9/2012 |
| CN | 102786879 A | 11/2012 |
| CN | 102804343 A | 11/2012 |
| CN | 103305886 A | 9/2013 |
| EP | 0 860 866 | 8/1998 |
| JP | 06151397 A | 5/1994 |
| JP | H07-72357 B2 | 8/1995 |
| JP | 2003-129283 A | 5/2003 |
| JP | 2006-004955 | 1/2006 |
| JP | 2007-138304 | 6/2007 |
| JP | 2009-064599 A | 3/2009 |
| KR | 10-1999-0029433 A | 4/1999 |
| KR | 10-2001-0052062 A | 6/2001 |
| KR | 10-2004-0020882 A | 3/2004 |
| KR | 10-2007-0071097 A | 7/2007 |
| TW | 483040 B | 4/2002 |
| TW | 200716793 | 5/2007 |
| TW | I281516 | 5/2007 |
| TW | 201109481 A1 | 3/2011 |
| WO | WO 1999/010566 | 3/1999 |
| WO | WO 1999/041434 | 8/1999 |
| WO | WO 01/68952 | 9/2001 |
| WO | WO 2002/062446 | 8/2002 |
| WO | WO 2007/112768 | 10/2007 |
| WO | WO 2010/148147 | 12/2010 |
| WO | WO 2012/022660 | 2/2012 |

OTHER PUBLICATIONS

U.S. Notice of Allowance dated Feb. 17, 2017, issued in U.S. Appl. No. 14/102,239.
U.S. Office Action, dated Nov. 12, 2015, issued in U.S. Appl. No. 14/182,767.
U.S. Office Action, dated May 20, 2016, issued in U.S. Appl. No. 14/182,767.
U.S. Notice of Allowance, dated Nov. 25, 2016, issued in U.S. Appl. No. 14/182,767.
U.S. Office Action, dated Jun. 5, 2015, issued in U.S. Appl. No. 14/085,262.
U.S. Final Office Action, dated Oct. 23, 2015, issued in U.S. Appl. No. 14/085,262.
U.S. Notice of Allowance, dated May 3, 2016, issued in U.S. Appl. No. 14/085,262.
U.S. Notice of Allowance, dated Jun. 23, 2016, issued in U.S. Appl. No. 14/613,306.
U.S. Notice of Allowability, dated Oct. 12, 2016, issued in U.S. Appl. No. 14/613,306.
U.S. Office Action, dated Feb. 5, 2016, issued in U.S. Appl. No. 14/638,750.
U.S. Office Action, dated Aug. 10, 2016, issued in U.S. Appl. No. 14/638,750.
U.S. Notice of Allowance, dated Dec. 21, 2016 issued in U.S. Appl. No. 14/638,750.
U.S. Office Action, dated Jun. 27, 2012 issued in U.S. Appl. No. 12/684,787.
U.S. Office Action, dated Apr. 8, 2013 issued in U.S. Appl. No. 12/684,787.
U.S. Final Office Action, dated Jul. 24, 2013 issued in U.S. Appl. No. 12/684,787.
U.S. Office Action, dated Oct. 29, 2013 issued in U.S. Appl. No. 12/684,787. .
U.S. Final Office Action, dated Mar. 3, 2014 issued in U.S. Appl. No. 12/684,787.
U.S. Office Action, dated Aug. 26, 2014 issued in U.S. Appl. No. 12/684,787.
U.S. Notice of Allowance, dated Oct. 10, 2014 issued in U.S. Appl. No. 12/684,787.
U.S. Notice of Allowance (Supplemental Notice of Allowability), dated Oct. 22, 2014 issued in U.S. Appl. No. 12/684,787.
U.S. Notice of Allowance (Supplemental Notice of Allowability), dated Oct. 28, 2014 issued in U.S. Appl. No. 12/684,787.
U.S. Office Action, dated May 22, 2017 issued in U.S. Appl. No. 14/593,676.
U.S. Notice of Allowance, dated Aug. 31, 2017 issued in U.S. Appl. No. 14/593,676.
U.S. Office Action, dated Apr. 12, 2011, issued in U.S. Appl. No. 12/684,792.
U.S. Final Office Action, dated Jul. 26, 2011, issued in U.S. Appl. No. 12/684,792.
U.S. Office Action, dated Sep. 27, 2013, issued in U.S. Appl. No. 12/684,792.
U.S. Final Office Action, dated Apr. 10, 2014, issued in U.S. Appl. No. 12/684,792.
U.S. Office Action, dated Oct. 23, 2015, issued in U.S. Appl. No. 14/326,899.
U.S. Notice of Allowance, dated May 6, 2016, issued in U.S. Appl. No. 14/326,899.
U.S. Notice of Allowance, dated Aug. 26, 2016, issued in U.S. Appl. No. 14/326,899.
U.S. Notice of Allowance [Corrected Notice of Allowability], dated Jun. 28, 2017, issued in U.S. Appl. No. 14/326,899.
U.S. Office Action, dated Jul. 29, 2015, issued in U.S. Appl. No. 13/775,987.
U.S. Notice of Allowance, dated Mar. 14, 2016, issued in U.S. Appl. No. 13/775,987.
U.S. Notice of Allowance (Corrected Notice of Allowability), dated Apr. 26, 2016, issued in U.S. Appl. No. 13/775,987.
U.S. Notice of Allowance (Corrected Notice of Allowability), dated Jun. 17, 2016, issued in U.S. Appl. No. 13/775,987.
U.S. Notice of Allowance, dated Jul. 5, 2017, issued in U.S. Appl. No. 15/181,150.
U.S. Notice of Allowance (Corrected Notice of Allowability), dated Sep. 5, 2017, issued in U.S. Appl. No. 15/181,150.
U.S. Office Action, dated Jun. 6, 2013, issued in U.S. Appl. No. 12/961,274.

(56) References Cited

OTHER PUBLICATIONS

U.S. Final Office Action, dated Oct. 28, 2013, issued in U.S. Appl. No. 12/961,274.
U.S. Notice of Allowance, dated Jan. 21, 2014, issued in U.S. Appl. No. 12/961,274.
U.S. Office Action, dated Jul. 25, 2014, issued in U.S. Appl. No. 12/961,274.
U.S. Final Office Action, dated Nov. 28, 2014, issued in U.S. Appl. No. 12/961,274.
U.S. Notice of Allowance, dated May 27, 2015, issued in U.S. Appl. No. 12/961,274.
Chinese First Office Action dated Nov. 2, 2015 issued in Application No. CN 201310676660.7.
Chinese Second Office Action dated Jun. 20, 2016 issued in Application No. CN 201310676660.7.
Chinese Third Office Action dated Jan. 5, 2017 issued in Application No. CN 201310676660.7.
Chinese Decision of Final Rejection dated Apr. 7, 2017 issued in Application No. CN 201310676660.7.
Taiwan Examination Report dated Mar. 17, 2017 issued in Application No. TW 102145646.
Chinese First Office Action dated Aug. 3, 2016 issued in Application No. CN 201410658497.6.
Chinese Second Office Action dated Feb. 22, 2017 issued in Application No. CN 201410658497.6.
Chinese First Office Action dated Jul. 18, 2017 issued in Application No. CN 201610124296.7.
PCT International Search Report and Witten Opinion, dated Jan. 5, 2011, issued in PCT/US2010/038901.
PCT International Preliminary Report on Patentability and Written Opinion dated Jan. 5, 2012, issued in PCT/US2010/038901.
Chinese First Office Action dated Aug. 14, 2014 issued in Application No. CN 201080026847.7.
Korean Office Action, dated Jan. 5, 2012 in Application No. KR 2010-7026340.
Taiwan Office Action dated Nov. 18, 2014 issued in Application No. TW 099119625.
Taiwan Office Action dated Mar. 22, 2016 issued in Application No. TW 104118528.
Taiwan Examination and Search Report dated Oct. 13, 2016 issued in Application No. TW 102108847.
Chinese First Office Action dated Apr. 5, 2017 issued in Application No. CN 201510239529.3.
Chinese First Office Action dated Jul. 7, 2016 issued in Application No. CN 201310080545.3.
Li, Guang et al., (2002) "Quantitative analysis of HBsAg in vaccinum hepatitis B by high performance capillary zone electrophoresis," *Analytical Instrumentation*, Issue 1, pp. 21-23 [Abstract Only].
U.S. Appl. No. 09/872,340, filed May 31, 2001, Patton et al.
U.S Office Action, dated Aug. 31, 2005, issued in U.S. Appl. No. 09/872,340.
U.S. Office Action, dated Apr. 14, 2005, issued in U.S. Appl. No. 09/872,340.
U.S. Office Action, dated Jan. 18, 2006, issued in U.S. Appl. No. 09/872,340.
U.S. Office Action, dated May 26, 2006, issued in U.S. Appl. No. 09/872,340.
U.S. Office Action, dated Nov. 8, 2006, issued in U.S. Appl. No. 09/872,340.
U.S. Final Office Action, dated Mar. 14, 2007, issued in U.S. Appl. No. 09/872,340.

* cited by examiner

METHODS AND APPARATUS FOR WETTING PRETREATMENT FOR THROUGH RESIST METAL PLATING

CROSS-REFERENCE TO RELATED APPLICATIONS

This application is a division of and claims priority from U.S. patent application Ser. No. 15/181,150, filed on Jun. 13, 2016, which is a continuation of and claims priority from U.S. patent application Ser. No. 13/775,987, filed on Feb. 25, 2013 (now U.S. Pat. No. 9,455,139, issued on Sep. 27, 2016), which claims benefit under 35 U.S.C. § 119(e) to U.S. Provisional Application No. 61/610,316, filed on Mar. 13, 2012, which are herein incorporated by reference. U.S. patent application Ser. No. 13/775,987 is also a continuation-in-part of and claims priority from U.S. patent application Ser. No. 12/684,792 (now abandoned), filed on Jan. 8, 2010, which claims benefit under 35 U.S.C. § 119(e) to U.S. Provisional Application No. 61/218,024, filed Jun. 17, 2009, both of which are herein incorporated by reference.

FIELD OF THE INVENTION

The embodiments disclosed herein relate to pre-wetting apparatus designs and methods. More specifically, embodiments relate to pre-wetting apparatus designs and methods for pre-wetting a semiconductor wafer prior to depositing electrically conductive materials on the wafer for integrated circuit manufacturing.

BACKGROUND

Wetting is a property of a liquid/solid interface governed by adhesive forces between the liquid and solid and cohesive forces in the liquid. Adhesive forces between the liquid and solid cause the liquid to spread across the solid surface. Cohesive forces in the liquid cause the liquid to minimize contact with the solid surface. The wetting of a solid surface by a liquid is important in many industrial processes where a liquid interacts with a solid surface. Electroplating (a cathodic process), including electroplating in integrated circuit manufacturing, is one such industrial process. Wetting is also important in anodic processes, including electroetching and electropolishing.

For example, many semiconductor and microelectronic processes make use of through resist electrodeposition. This plating process is also sometimes referred to as through-mask or photoresist patterned electrodeposition. These processes may be associated with plating submicrometer gold interconnects on GaAs wafers, plating copper coils or magnetic alloys for thin-film recording heads, plating copper conductors for redistribution or integrated passive applications, or plating PbSn or lead-free solders for flip chip connection. All of these processes involve substrates having a blanket conductive seed layer, or a conductive plating base, and a patterned dielectric template, into which metal is deposited.

SUMMARY

Methods and apparatus for pre-treating substrates prior to through-resist plating or other to processing are provided. The substrates are pre-wetted and cleaned such as to remove contaminating particulate material, including photoresist particles and residue and to provide a wetted surface suitable for subsequent processing.

In one aspect an apparatus is provided. The apparatus includes a degasser configured to remove one or more dissolved gasses from a pre-wetting fluid to produce a degassed pre-wetting fluid and a process chamber which includes a wafer holder configured to hold a wafer substrate and configured to rotate the wafer substrate, a vacuum port configured to allow formation of a subatmospheric pressure in the process chamber, and a fluid inlet coupled to the degasser and configured to deliver the degassed pre-wetting fluid onto the wafer substrate at a velocity of at least about 7 meters per second whereby particulate material (including particles and residue) on the wafer substrate is dislodged and at a flow rate whereby dislodged particles are removed from the wafer substrate. The apparatus further may include a controller comprising program instructions for rotating the wafer substrate, and forming a wetting layer on the wafer substrate at the sub-atmospheric pressure in the process chamber by contacting the wafer substrate with the degassed pre-wetting fluid from the degasser and admitted through the fluid inlet at a flow rate of at least about 0.4 liters per minute, the degassed pre-wetting fluid being in a liquid state, while rotating the wafer substrate. Provided fluid velocities and fluid flow rates are selected such as to be sufficient to dislodge and remove particulate material from the substrate, and appropriate fluid delivery methods, including fan nozzles, are provided.

The degasser, in some embodiments is a membrane contractor degasser configured to produce degassed pre-wetting fluid for contacting the wafer substrate having about 0.5 ppm or less dissolved atmospheric gas. The fluid is preferably a deionized water or a chemical solution that aids in dislodging and removing particles from the wafer substrate. The vacuum port in some embodiments is located below the wafer holder. The apparatus in some embodiments is configured to maintain the subatmospheric pressure of less than about 50 Torr during forming of the wetting layer on the wafer substrate.

In some embodiments the fluid inlet includes a nozzle configured to deliver the degassed pre-wetting fluid onto the wafer substrate. In some embodiments the nozzle is mounted on a sidewall of the process chamber, and is, in some implementations, a fan nozzle configured to deliver the degassed pre-wetting fluid onto the wafer substrate such that the degassed pre-wetting fluid that impinges the wafer substrate has a shape of a line. In some embodiments the fluid inlet includes a manifold including at least one nozzle configured to deliver the degassed pre-wetting fluid onto the wafer substrate, wherein the nozzle is located over the wafer substrate, and which is a fan nozzle configured to deliver the degassed pre-wetting fluid onto the wafer substrate such that the degassed pre-wetting fluid that impinges the wafer substrate has a shape of a line.

In some embodiments the process chamber includes a cover and a body, wherein the cover remains stationary and the body is configured to move in a substantially vertical manner to bring the body into contact with the cover and to form a vacuum seal, and wherein the nozzle of the manifold mentioned above is attached to the cover. The nozzle of the manifold is configured, in some embodiments, to deliver the degassed pre-wetting fluid onto the wafer substrate from an edge of the wafer substrate to substantially the center of the wafer substrate.

In some embodiments the wafer holder is configured to hold the wafer substrate in a substantially face-up orientation, and the apparatus is configured to spray the pre-wetting fluid onto the wafer substrate from high-velocity nozzles.

A typical substrate which can be pre-wetted in such an apparatus includes a metal layer and an overlying photoresist, wherein features in the photoresist expose portions of the metal layer. In some embodiments the features in the photoresist include features having aspect ratios of about 2 to 1 to about 1 to 2, wherein the features in the photoresist have openings having a size of about 5 micrometers to 200 micrometers.

In some embodiments the program instructions of the controller further include instructions for: after forming the wetting layer on the wafer substrate, stopping delivery of the degassed pre-wetting fluid, and after stopping the delivery of the degassed pre-wetting fluid, rotating the wafer substrate at a different rotation rate to remove excess surface entrained degassed pre-wetting fluid from the wafer substrate.

In some embodiments the program instructions of the controller further include instructions for increasing pressure in the process chamber to atmospheric pressure or to above atmospheric pressure after stopping the delivery of the degassed pre-wetting fluid and prior to removal of the excess surface entrained pre-wetting fluid.

Typically the program instructions further include instructions for reducing pressure in the process chamber to the subatmospheric pressure prior to forming the wetting layer on the wafer substrate. For example the program instructions may specify initiating the formation of the wetting layer on the wafer substrate when a pressure in the process chamber is reduced to less than about 50 Torr and contacting the wafer substrate with the degassed pre-wetting fluid for about 10 seconds to 120 seconds.

In another aspect, a system is provided, which includes the apparatus described above and a stepper.

In another aspect a method is provided, wherein the method includes: (a) providing a wafer substrate having an exposed metal layer on at least a portion of a surface of the wafer substrate to a process chamber; (b) reducing pressure in the process chamber to a subatmospheric pressure; (c) degassing a pre-wetting fluid; (d) rotating the wafer substrate; and (e) contacting the rotating wafer substrate with the degassed pre-wetting fluid at the subatmospheric pressure in the process chamber to form a wetting layer on the wafer substrate, the degassed pre-wetting fluid contacting the wafer substrate at a velocity of at least about 7 meters per second that is sufficient to dislodge any particulate material on the exposed metal layer and at a flow rate of at least about 0.4 liters per minute that is sufficient to remove dislodged particulate material from the wafer substrate.

In some embodiments the method further includes: applying photoresist to the wafer substrate; exposing the photoresist to light; patterning the resist and transferring the pattern to the wafer substrate; and selectively removing the photoresist from the work piece.

In another aspect a non-transitory computer machine-readable medium including program instructions for control of an apparatus is provided, wherein the program instructions include code for operations comprising: (a) providing a wafer substrate having an exposed metal layer on at least a portion of a surface of the wafer substrate to a process chamber; (b) reducing pressure in the process chamber to a subatmospheric pressure; (c) degassing a pre-wetting fluid; (d) rotating the wafer substrate; and (e) contacting the rotating wafer substrate with the degassed pre-wetting fluid at the subatmospheric pressure in the process chamber to form a wetting layer on the wafer substrate, the degassed pre-wetting fluid contacting the wafer substrate at a velocity of at least about 7 meters per second that is sufficient to dislodge any particulate material on the exposed metal layer and at a flow rate of at least about 0.4 liters per minute that is sufficient to remove dislodged particulate material from the wafer substrate.

DETAILED DESCRIPTION

Figure 1:
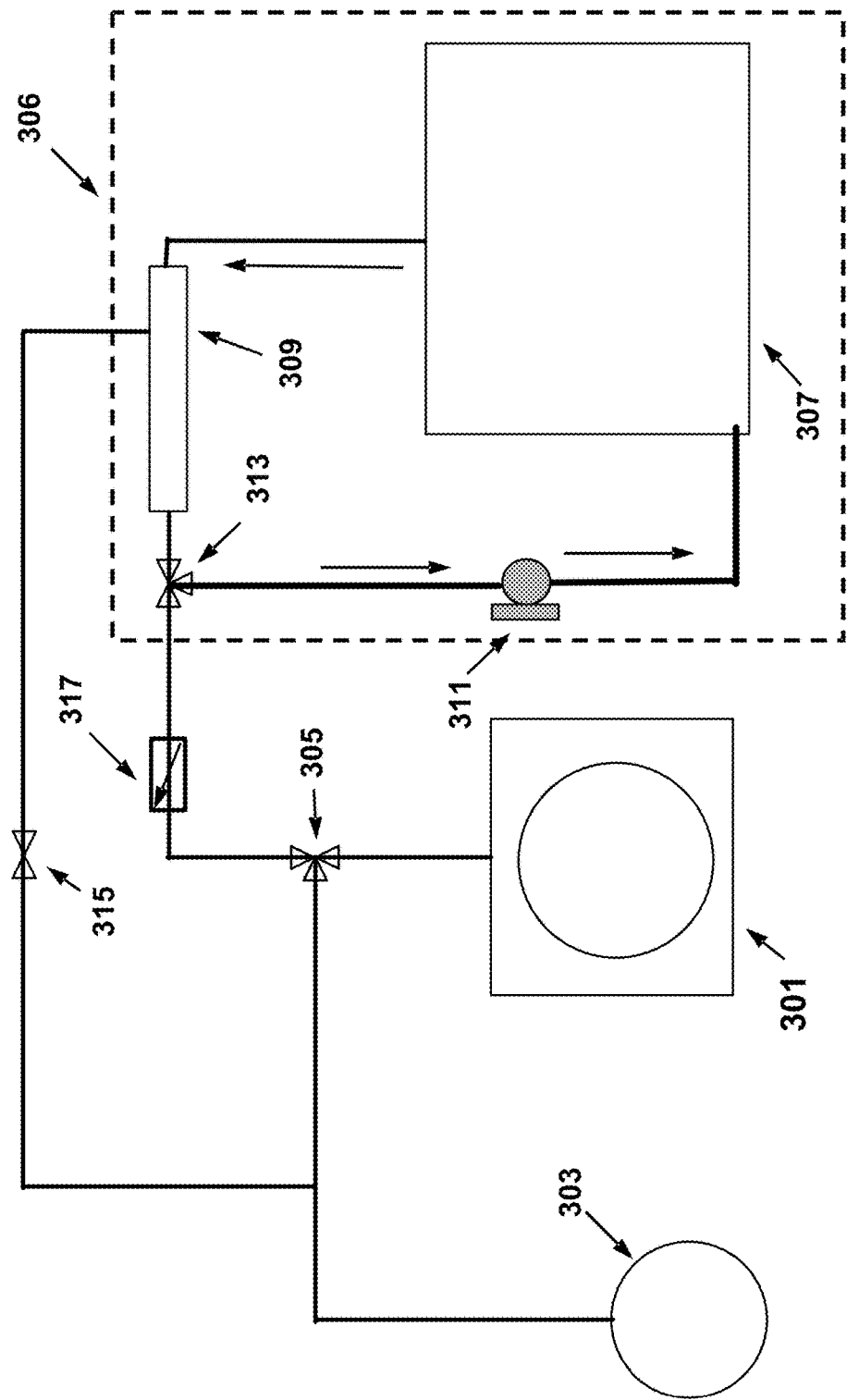
FIG. 1 depicts a schematic layout of one embodiment of a pre-wetting apparatus.

Reference will now be made to specific embodiments. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Disclosed herein are apparatus designs and methods for wafer pre-wetting, for modifying the conditions of wafer entry and wafer processing during plating, and pre-wetting fluid compositions. The pre-wetting process, in accordance with embodiments provided herein, can be performed in the electroplating chamber or in a separate pre-wetting station of a module which includes a pre-wetting station and an electroplating station. In some embodiments pre-wetting and electroplating are performed in separate apparatuses.

The substrate typically is a semiconductor wafer which has a layer of conductive material residing thereon (e.g., a seed layer comprising copper or copper alloy). During electroplating, electrical connections are made to the conductive layer and the wafer substrate is negatively biased, thereby serving as a cathode. The wafer is contacted with a plating solution containing a metal salt (e.g., copper sulfate, a copper alkylsulfonate, or a mixture of salts), which is reduced at the wafer cathode resulting in metal deposition on the wafer. In many embodiments, the substrate contains one or more recessed features (e.g., vias or holes), which need to be filled by the electroplating process. The plating solution, in addition to metal salts, may also contain an acid, and typically contains one or more additives such as halides (e.g., chloride, bromide, etc.), accelerators, levelers, and suppressors, used to modulate electrodeposition rates on various surfaces of the substrate.

The disclosed processes and associated apparatus designs are particularly applicable and necessary for electrofilling wider (e.g., typically greater than 5 μm) and deeper (e.g., typically greater than 10 μm) damascene structures (vias), such as those commonly found in emerging copper through silicon via (TSV) electrofill structures or in recessed features associated with through resist plating. Through silicon via structures are further described in U.S. Pat. No. 7,776,741, issued Aug. 17, 2010, which is herein incorporated by reference. Gas bubbles, trapped or otherwise residing on the surface or within a feature, will interfere with the field and feature plating process either by blocking the feature surface with the non-conducting gas, or by creating an impediment to the free passage of current. The disclosed processes and associated apparatus designs enable void-free copper electrofilling.

Electroplating and electrofill of TSV and through resist interconnections present a number of challenges. These include long plating times due to very large and/or deep structures, or incomplete plating due to poor feature wetting or poor seed layer coverage. Further, it is important to ensure that the interior of all recessed features are filled with liquid and that there are no trapped gasses inside the features that prevent plating therein. The pre-wetting apparatus designs and methods described herein are generally described with respect to electroplating (a cathodic process) a metal, specifically copper. However, the pre-wetting apparatus designs and methods described herein are generally applicable to all electrolytic processes, including eletroetching and electropolishing, both of which are anodic processes.

Methods for forming liquid-filled, bubble-free, particle-free recessed features that are needed for the plating process are described. Further, compositions of pre-wetting fluids which minimize seed layer corrosion and simultaneously increase plating rates are described.

Apparatus

Generally, the apparatus designs and methods described herein avoid the formation of a bubble within a recessed feature (e.g., a via) on a wafer substrate by first removing gas, primarily all non-condensable gasses (e.g., nitrogen and oxygen), from within the feature before pre-wetting the surface and feature with a fluid. To accomplish this, the wafer with the recessed features is placed in a vessel that is suitable for both holding the wafer and removing the gas from the wafer surfaces (e.g., a vacuum vessel). In addition to the vessel itself, a mechanism for removing the gas (e.g., a line connected to a vacuum source such as a pump) and a mechanism for depositing liquid onto the surface while the vacuum conditions are maintained, are needed.

Described herein are various apparatus designs for pre-wetting a wafer prior to, or within a short time after, the initiation of a plating process, where bubbles and gas that might otherwise be trapped within features recessed in a surface are avoided. Embodiments of a pre-wetting apparatus include various elements. Typically, a pre-wetting apparatus includes a pre-wetting fluid storage and return tank, including liquid mixing devices and liquid level controllers and sensors. In some embodiments, the apparatus includes a pre-wetting fluid degassing flow loop. Such a degassing flow loop includes a circulating pump, routing/diverting valves, a liquid degassing element, and a connection between the liquid degassing element and the system vacuum pump (used to pump down and apply vacuum to various liquid degassing elements on the tool and the pre-wetting chamber), in some embodiments. A pre-wetting apparatus also includes a pre-wetting chamber. A pre-wetting chamber, in some embodiments, includes a two position (open/closed) vacuum wafer access door or lid for access to the chamber and a combined door or lid and splash shield that prevents liquid from hitting and subsequently dropping from the upper walls or door onto the wafer surface. In some embodiments, inside the chamber is a wafer holder for supporting and rotating the wafer within the chamber. In some embodiments, the chamber includes an air-dome chamber-heater, used to prevent liquid condensation on the walls of the chamber that would otherwise reside above the wafer and the vacuum wafer access door and potentially drip onto the wafer. Pre-wetting chambers typically include an inlet port for pre-wetting fluid to enter the chamber and to direct pre-wetting fluid to land on the upper surface of the rotating wafer and an inlet line and chamber port for drawing and releasing vacuum on the chamber, the inlet line containing a particle filtration device and the inlet port containing a flow diffuser configured to disperse incoming gas flow and minimize chamber flow turbulence. In some embodiments, the chamber includes liquid level sensors for monitoring an empty/ready and overflow/over-full condition. Pre-wetting chambers also typically include a drain for removing liquid from the chamber and directing the drained fluid back to the storage tank.

Embodiments described herein overcome the deleterious effects of trapped bubbles, particularly those bubbles which can be formed in larger vias or trenches in a wafer, by: (1) avoiding trapping gas in the via during pre-wetting altogether by removing substantially all of the atmospheric non-condensable gasses above the wafer and from within the via or hole, and then pre-wetting the wafer with pre-wetting fluid; and/or (2) significantly increasing the rate a bubble will dissolve by applying a large external pressure on the fluid, thereby driving the bubble to dissolve in the fluid by creating a large supersaturated condition at the bubble interface. In addition to these pre-treating and pre-plating measures, in some embodiments plating is performed in a plating solution that is maintained in a degassed state, and in other embodiments, the plating solution is degassed in the line just prior to being exposed to the wafer surface.

In some embodiments it is possible to perform pre-wetting within an electroplating cell, where the pre-wetting fluid has the same composition as the plating solution. However, for a variety of reasons, including the hardware complexity of combining plating processes with vacuum processes, pre-wetting (including vacuum feature-backfilled pre-wetting) is often performed in a different cell, sub-cell, or module than the plating cell. When pre-wetting under vacuum is performed in a distinctly different area of the plating cell, or in a distinctly separate module from the plating cell, rather than in the plating solution, the composition of the pre-wetting fluid can be selected. The pre-wetting fluid may have the same, or very similar, composition as that subsequently used for plating the wafer. The pre-wetting fluid may include all the elements of the plating bath (e.g., the same solvent(s) and same dissolved metal ions, acids, cation, additives and halides, at the same or very similar concentrations as in the plating solution). Such a pre-wetting fluid may work in some embodiments. Alternatively, in other embodiments, a pre-wetting fluid that is very different from the plating solution may be used. For example, in some embodiments, a pre-wetting fluid of 1) water, 2) a fluid with a substantially higher metal ion concentration than that of the plating solution, 3) a fluid having either a lower, different combination of, or no dissolved halides, 4) a fluid substantially free of one, a few, or all of the plating additives, or 5) water-miscible solvents may be used as pre-wetting fluids. Such pre-wetting fluids are further described herein.

A number of factors should be considered when selecting a pre-wetting fluid composition, including the possibilities of: a) corroding the metal layers on a wafer substrate before initiation of plating; b) inhibiting the plating process (i.e., slowing down or inhibiting altogether the feature metal-filling process); c) the loss of pre-wetting fluid to subsequent pre-wetting fluid reuse; and d) altering (by adding, diluting, or concentrating) various critical species concentrations within the plating bath over time. The latter process may alter the metal ion concentrations, halide concentrations, organic additives, etc., in the plating bath. These effects can be quite substantial. Furthermore, when using a pre-wetting fluid of a different composition than the plating bath, performing the pre-wetting process in the same module without enabling suitable mechanisms of removing and recovering excess entrained pre-wetting fluid that would be added to the plating solution would generally require mechanisms for mitigating, monitoring and/or otherwise correcting for plating solution modification over time. On the other hand, the use of hardware and a process wherein the pre-wetting operation is performed in a separate treatment station, module, vessel, or sub-vessel of the plating cell that allows for separation and recovery of this fluid may be advantageous because it can avoid such issues. With this background, and in order to simplify the description of core concepts of embodiments, many embodiments are described hereafter in the context of a separate pre-wetting "station" and a separate "plating station", with the wafer being transferred from the former to the latter. However, while perhaps favorable in some circumstances (e.g., for avoiding mixing of unlike liquids or for other reasons), the aspect of embodiments related to the particular choice of pre-wetting materials, the general fluid, and plating processing sequences are not intended to be so limited.

FIG. 1 depicts a schematic layout of one embodiment of a pre-wetting apparatus (i.e., chamber 301 and associated hardware). The chamber 301 is connected to vacuum pump 303 though an outlet in the chamber and through a three-way valve connection 305. On the other side of the three-way valve is degassing loop 306 that includes a pre-wetting fluid tank 307, a degassing device 309, and a pump 311 for circulating the pre-wetting fluid around the degassing loop. In another embodiment, the pre-wetting fluid feed line and the vacuum line are not connected except at the chamber, and each has its own valve (i.e., there is no three-way valve). In an alternative embodiment, the chamber has an inlet for admitting pre-wetting fluid and an outlet adapted for connection with a vacuum pump. The position of the pump 311 can be after the degassing element, if it is desired to drive the fluid into the chamber by the pump rather than by being sucked into the chamber by a pressure differential between the pre-wetting fluid tank 307 and the chamber 301.

In some embodiments, the area in the pre-wetting fluid holding tank 307 is purged of gasses by applying a vacuum to the holding tank using a vacuum pump (not shown) so that a minimum amount of dissolved gas is achieved. The rate of removal of the gas from the pre-wetting fluid can also be increased by increasing the exposed surface of the fluid to the vacuum, for example, by having the fluid re-enter the chamber from the circulation loop in a spray or through a spray column. In the embodiment of the system shown in FIG. 1, pre-wetting fluid is circulated though the degassing device 309 (e.g., in some embodiments, a membrane contact degasser) for removing one or more dissolved gases (e.g., both $O_2$ and $N_2$) from the pre-wetting fluid prior to pre-wetting. Examples of commercially available degassing devices include the Liquid-Cel™ from Membrana of Charlotte, N.C. and the pHasor™ from Entegris of Chaska, Minn. The amount of dissolved gas can be monitored with an appropriate meter (e.g., a commercial dissolved oxygen meter (not shown)). The removal of the dissolved gas prior to the pre-wetting fluid entering chamber 301 can improve the pre-wetting process, as is described herein. After degassing the pre-wetting fluid, optionally, the valve 315 between the vacuum side of the degassing chamber 309 and the vacuum pump 303 is closed (this prevents gas initially in the chamber from becoming dissolved in the degassed pre-wetting fluid; in some embodiments, separate pumps can be used for these two functions).

Unlike conditions that exist when using an apparatus similarly configured to that of FIG. 1, if the pre-wetting fluid is not degassed prior to exposing it to a wafer under vacuum, dissolved gas from the fluid can be released from the fluid as it enters the chamber. This results in bubbles forming inside the vias. While not wanting to be limited by a particular model or theory, a via bottom is a location of negative curvature, and it is believed that this location is a particularly susceptible to nucleating a bubble and releasing gas from the pre-wetting fluid. If this occurs, bubbles will be formed from the pre-wetting fluid containing dissolved gas because it is supersaturated with gas under the pre-wetting conditions (e.g., vacuum in the chamber). The bubbles so formed can remain there after the pre-wetting process, which in turn can inhibit plating there and lead to associated defects. Therefore, in some embodiments (including the embodiment shown in FIG. 1), the pre-wetting fluid used in the pre-wetting process is a degassed pre-wetting fluid. In some embodiments, the degassed pre-wetting fluid may be a plating solution, and the pre-wetting methods described herein may be preformed in the same chamber as the plating chamber itself. If a separate pre-wetting chamber and apparatus are employed, but the pre-wetting fluid is not degassed, then intermittent and unreliable filling results may be observed. For example, when holes on a wafer are filled with pre-wetting fluid (with the wafer under vacuum) without first degassing the pre-wetting fluid, it has been found that approximately 15% of the holes still have air bubbles in them (as indicated by the same percentage having post-plating voids, indicative of trapped gas bubble therein). Thus, in some embodiments, it is important to perform pre-wetting under vacuum (i.e., at a subatmospheric pressure) and with a degassed fluid.

In contrast, the use of a degassed pre-wetting fluid in combination with a pre-wetting operation under vacuum (i.e., at subatmospheric pressure) leads, in some embodiments, to significantly fewer feature voids than when pre-wetting under vacuum alone is employed. In specific embodiments that give good protection against forming non-uniform deposits, a combination of a degassed pre-wetting fluid with pre-wetting under vacuum is further combined with plating in a plating solution that is degassed. The plating solution may be degassed only in the initial stages of plating (e.g., for only about the first 10 minutes of the plating process), or remain degassed for the entire plating process (e.g., if the plating time is greater). Experiments performed under these conditions produced vias that were void free.

Returning to FIG. 1, after the pressure in chamber 301 has reached a low value (i.e., a subatmospheric pressure), the three-way valve 305 to the vacuum pump location is switched to connect to the line from the degassing loop 306, and the three-way valve 313 of the degasser loop is set to allow fluid to be directed into the vacuum chamber 301. In some embodiments, the subatmospheric pressure is about equal to that of the boiling pressure of the pre-wetting fluid at the temperature of operations, which for water at ambient temperature is about 20 torr. In other embodiments, the subatmospheric pressure is about 50 torr. In further embodiments, the pressure of 50 torr is maintained while pre-wetting the wafer substrate. In alternative embodiments, the pre-wetting system is configured to initiate introduction of the pre-wetting fluid into the chamber and onto the wafer substrate after the pressure in the chamber has been reduced to less than about 50 Torr. In embodiments where the pre-wetting fluid tank 307 is at atmospheric pressure, liquid is drawn into the chamber 301 by the pressure differential between the vacuum chamber and the pre-wetting fluid tank.

The pre-wetting fluid wets the device side of the wafer surface of a wafer in the chamber 301. Needle valve 317 can be used to meter the flow of the pre-wetting fluid into chamber 301. Embodiments of chamber 301 are described herein. Chamber 301, in some embodiments, is a pressure chamber configured to apply an external pressure to increase the rate of bubble dissolution, as described herein. In further embodiments of a pre-wetting apparatus, the pre-wetting apparatus includes a transfer mechanism configured for transferring the wafer substrate from the pre-wetting chamber to an electroplating apparatus.

In some embodiments, the pre-wetting fluid is cooled prior to injection into the pre-wetting chamber (e.g., 0° C. for water, or −10° C. for suitable electrolytes). In other embodiments, the degasser is configured for cooling the pre-wetting fluid to a temperature of less than about 20° C. Other examples of methods for cooling the pre-wetting fluid include passing the fluid over a heat exchanger in the pre-wetting fluid holding tank or though a in-line cooler (both not shown in FIG. 1). Cooling the pre-wetting fluid reduces the partial vapor pressure of the solvent of the pre-wetting fluid, which allows for greater applied vacuum, for example, to the degassing device. Lowering the temperature of the pre-wetting fluid can also be effective in increasing both the surface tension and viscosity of the pre-wetting fluid, which tends to make the phenomena of degassing device "blow through" or "weeping" less prevalent. Weeping can be a particularly difficult problem when dealing with salt containing pre-wetting fluids, because weeping salt laden fluids tend to dry and destroy the pores of the degassing device. Using lower temperature fluids reduces the tendency of salt laden electrolyte to evaporate and flow, avoiding this known source of degassing device failure. For example, the vapor pressure of water (with a small amount of salt) is about 2.7 torr at −10° C. versus 17.5 torr at 20° C. and 32 torr at 30° C. With a 20 torr vacuum (yielding about 0.5 ppm dissolved atmospheric gas) applied to a degassing device, a 30° C. pre-wetting fluid will literally boil and leave salts around the pores of the degassing device, and a 20° C. pre-wetting fluid will evaporate rapidly. Very little degassing device salting occurs when using a −10° C. pre-wetting fluid, however. Thus, in general, more dissolved gas can be removed more efficiently from a degassing device with a lower temperature fluid. In some embodiments, the pre-wetting fluid is cooled to a temperature of less than 20° C., for example 0° C. or less, while it is degassed and before it enters the processing chamber. Also, reducing the temperature of the pre-wetting fluid reduces the rate of metal corrosion in the pre-wetting system.

In some embodiments of a pre-wetting apparatus, the surface of a wafer is wetted with a pre-wetting fluid followed by the application of an external pressure to the fluid. The wafer surface is first contacted with the fluid using an appropriate mechanism, usually immersing the wafer in a pre-wetting fluid (described herein). In these embodiments, the pre-wetting chamber includes an inlet for admitting pre-wetting fluid and the chamber is configured for operating at a higher than atmospheric pressure during or after pre-wetting. The application of an external pressure to the fluid facilitates the removal of bubbles. In some embodiments, the pre-wetting fluid is preconditioned so that it is substantially free not just of oxygen (e.g., to minimize corrosion of the metal on the wafer), but of all dissolved non-condensable gasses, such as nitrogen and carbon dioxide, prior to the pre-wetting of the surface, to accelerate the dissolution rate of any trapped bubble in a recessed feature. Exposure of a wafer to deoxygenated processing fluid for use in the treatment of a semiconductor wafer is described in U.S. Pat. Nos. 6,021,791 and 6,146,468, which are incorporated herein by reference.

After immersion of the wafer into a pre-wetting fluid or covering of the wafer with a pre-wetting fluid, the region around the wafer (e.g., a pressure chamber) is closed and sealed, and an external pressure is applied to the chamber and fluid. Pressure may be applied pneumatically (e.g., introducing high pressure gas into the chamber in the area over the fluid), or hydraulically (e.g., with the chamber substantially free of non-dissolved gas and using a hydraulic piston or other suitable device to apply external pressure to the fluid). As the pressure in the chamber increases, the bubble will decrease from its original size. When using pneumatic (gas) pressure to compress the trapped bubble, it may be important to avoid dissolving substantial amounts of gas into the pre-wetting fluid, particularly in the vicinity of the bubble. In some embodiments, a stagnant, relatively thick layer of fluid, for example, greater than 1 cm in thickness, is used. In other embodiments, the pneumatic pressure is applied to the chamber though a long tube with a substantial resistance for dissolution of gas from reaching the interface so that the gas that contacts the liquid does so over a relatively small surface area and has a relatively long diffusion path, limiting the amount of gas that can dissolve in the fluid over a period of time. However pressure is applied, the driving force for dissolution of the trapped bubble will increase with applied pressure. For a large bubble without significant capillary pressure effects, the driving force for dissolution will be approximately equal to the product of the initial mole fraction of the particular gas component in the bubble and the difference in applied pressure to the chamber and the initial partial pressure of dissolved gas in the fluid. This later quantity will vary depending on the extent of degassing performed on the pre-wetting fluid.

While pressure can be applied either pneumatically or hydraulically, in pre-wetting embodiments that are not immersion embodiments, but rather coverage of a wafer with a thin layer of pre-wetting fluid, the pneumatically applied external pressure will potentially allow gas to redissolve quickly into a (e.g., degassed) thin layer of pre-wetting fluid. There is a competition between gas uptake from the external pressurized gas source versus gas dissolution into the liquid from the bubble. Therefore, a relatively thick layer of pre-wetting fluid should be used for non-immersion pre-wetting operations. Also, there are a limited number of practical mechanisms for applying hydrostatic pressure to the thin layer of pre-wetting fluid on a wafer. One possible mechanism for doing so is to create a face-up wafer and a pre-wetting liquid fluid containing cup. In contrast, there is a much wider tolerance with thick layers of pre-wetting fluid and the immersion pre-wetting method. This is because pressure can be transmitted to the bubble by a purely hydrostatic mechanism, and alternatively, application of pneumatic pressure will not quickly re-saturate the pre-wetting fluid around a bubble in a via with gas because of the relatively long diffusion distances involved.

When pressure is applied, with the gas partial pressure in the bubble exceeding that in the pre-wetting fluid, the bubble will begin to dissolve. Eventually the bubble will completely dissolve, the total time for which depends on parameters such as its initial size, the applied pressure, and the original depth of the bubble inside the feature. After the bubble has completely dissolved, some time should generally be allowed to pass before the pressure is released, so that any excess dissolved gas (beyond that which will be soluble at 1 atmosphere) can equilibrate into the pre-wetting fluid as a whole. This avoids the possibility of re-nucleating a bubble inside the feature. When this is procedure is followed, the bubble will be removed from the feature and not reform upon release of the excess external pressure.

Figure 2:
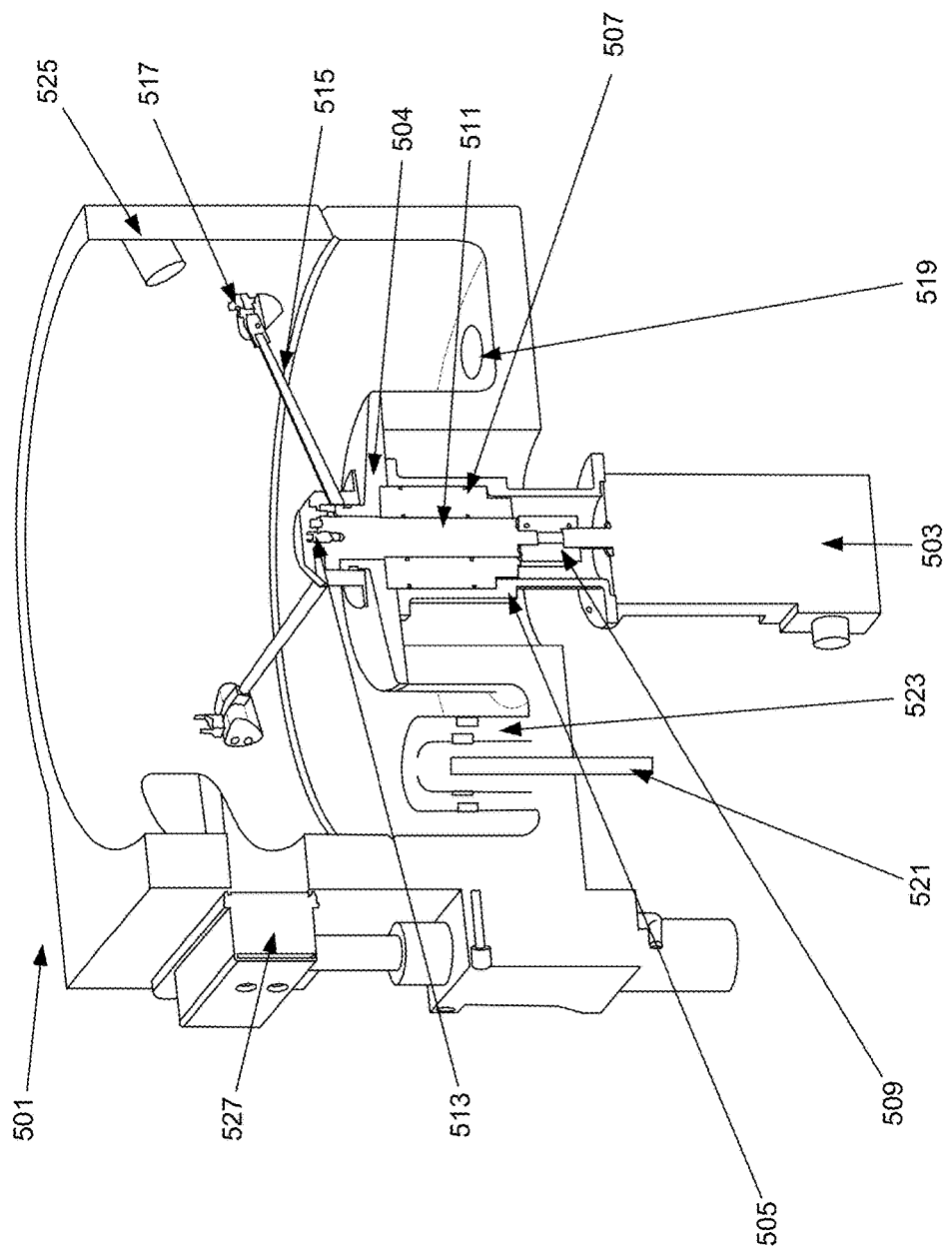
FIG. 2 depicts an isometric view of an embodiment of a pre-wetting chamber.

FIG. 2 depicts an isometric view of an embodiment of a pre-wetting chamber suitable for performing pre-wetting process described herein. Pre-wetting chamber 501 includes a motor 503 for rotating the wafer during processing is anchored below the chamber via the chuck to chamber base 504 by a motor-and-bearing supporting member 505, both of which also create a fluid seal between the bearing 507 and the underside of the chamber and the bearing. The bearing is a commercially available vacuum-pass-through central shaft rotary bearing. The motor is attached via a coupling 509 to a drive shaft 511 that passes though a vacuum isolating bearing to the chuck base 513. The chuck has three arms (515 is one arm) to support the wafer (wafer not shown), confinement pins, and other alignment apparatus 517 as appropriate.

At the lower section of the chamber is a drain 519 for removing excess pre-wetting fluid that may accumulate there after it is applied to the rotating wafer. The fluid is flung out toward the chamber walls and drops to the chamber base. In some embodiments, a wafer peripheral "fluid deflector shield" (not shown) is positioned approximately in the plane of the wafer to deflect fluid emanating from the wafer edge downward before hitting the chamber wall. The deflector shield may be moveable, or the wafer and wafer chuck plane may be adjusted by appropriate vertical moving mechanisms and seals. Also at the base of the chamber is a vacuum inlet and vacuum release line 521, housed in a fluid protecting shield 523 is some embodiments. This shield helps prevent surges of gasses from unnecessarily disturbing fluids within the chamber as well as minimizing the amount of liquid drawn into the vacuum line by isolating the two. While the vacuum line (and shield) can be located in the upper section of the chamber, it is advantageous to draw vacuum from below the wafer so as to minimize the propensity of any particles falling onto the wafer and forming defects. This can occur if particles or other materials enter the chamber during back filling the chamber with a gas or from the ambient environment while the chamber door is open. To minimize particles and other materials from entering the chamber, the chamber is typically backfilled with a particle-filtered inert gas such as nitrogen, carbon dioxide, or argon, and a slight positive pressure of clean particle free gas is feed to the chamber while the door is open. The backfill gas is typically filtered and the entering fluid enters a flow diffuser mounted on the wall of the chamber, so as to avoid a gas flow jet that might dry the wafer or disturb any chamber contents unnecessarily.

In some embodiments, a pre-wetting fluid nozzle 525 is located above and to the side but not over the centrally located wafer and wafer chuck, oriented and configured to spray or stream fluid to reach the wafer central regions. In other embodiments, the pre-wetting fluid nozzle is attached to a movable arm which can be positioned over the wafer. In the embodiment shown in FIG. 2, the chamber vacuum door 527 is located along the walls of the chamber, and configured to seal to the chamber itself. It can be moved away from the chamber as well as downwards (or upwards) so a wafer can enter the chamber freely, and then be repositioned to the sealing position after a wafer is placed onto the wafer holding chuck. The doors and other elements that potentially could hold entrained fluid should be designed such that the fluid may not drip onto the wafer. For example, the door's retracted position and associated hardware may be positioned below the plane that the wafer creates on insertion into the chamber, so as to avoid dripping fluid of otherwise contaminating the wafer during transit in or out of the chamber.

In some embodiments, the upper section of the chamber, particularly the areas above the plane where the wafer resides in the chuck and is extracted through the door, are heated above the temperature of the wafer that is to be pre-wetted. This includes both the areas that reside above the wafer (top surface or vacuum dome, not shown in FIG. 2) as well as the peripheral areas around the wafer. This heating is useful in avoiding liquid from dropping from the ceiling of the chamber onto the wafer before vacuum conditions are established, potentially trapping an air bubble inside a via where the drop fell, circumventing the desired process of putting a pre-wetting fluid onto the wafer only when air is first removed from the vias. Similarly, during the placement of a wafer into the chamber, liquid falling from the walls onto the wafer surface would have a similar effect. By heating the chamber walls, condensation on the walls and ceiling is avoided, as well as enabling the rapid evaporation of any stray droplets that might otherwise reach those positions, thereby keeping these areas dry.

While not shown in FIG. 2, in some embodiments a vertically moveable and automatable splash shield is positioned peripheral to the wafer and chuck and inside the chamber. The splash shield can be moved upwards during the application of fluid or at other times as suited to minimize and avoid, among other things, liquid from contacting the chamber door or upper walls. Alternatively, the wafer chuck can be moved downwards deeper into the chamber and below the plane of the vacuum door after wafer insertion, accomplishing the same purpose.

In other embodiments, rather than delivering a pre-wetting fluid to the wafer surface, the wafer is immersed in or otherwise covered with a pre-wetting fluid (e.g., by condensation) while vacuum conditions are maintained above the fluid and wafer. Since the creation of a vacuum within the chamber creates conditions where there is substantially no non-condensable gas in the chamber, the pre-wetting fluid is not impeded from entering a via. Put another way, the liquid does not need to displace any gas located within a via during pre-wetting, since the gas has been removed in a separate operation (pulling vacuum) prior to the pre-wetting operation.

Figure 3:
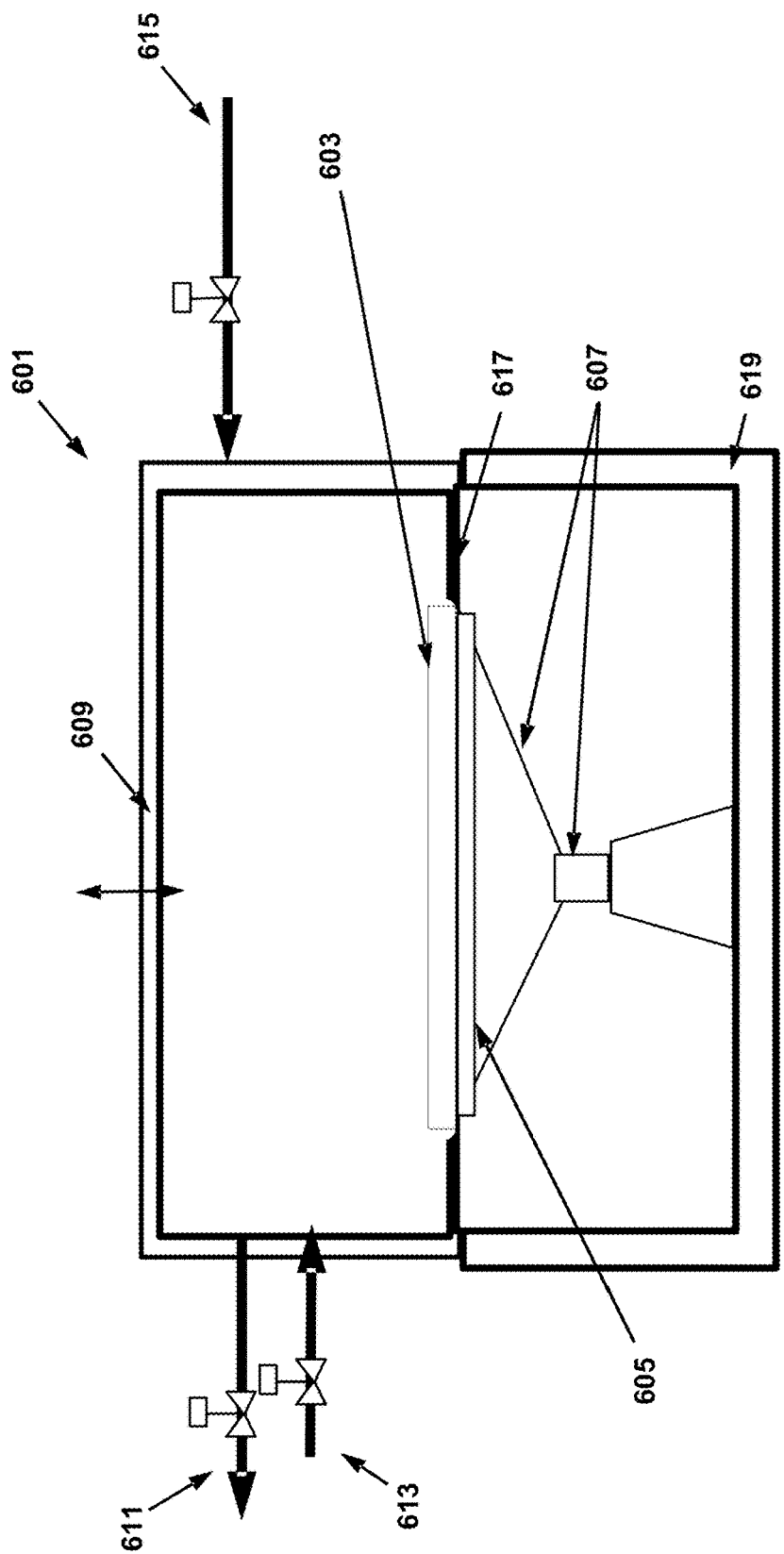
FIG. 3 depicts an embodiment of a pre-wetting chamber configured for a condensation pre-wetting process.

For example, in one embodiment, after vacuum is applied to the pre-wetting chamber, a condensable fluid vapor is created within the chamber or introduced to the chamber (e.g., vapors of water (e.g., low pressure steam), methyl alcohol, dimethylcarbonate, diethylcarbonate, isopropyl alcohol, dimethyl sulfoxide, and dimethyl formamide, or other liquid used as the subsequent plating electrolyte, easily dissolvable in a subsequent rinse, or soluble in the subsequent plating electrolyte). In embodiments where the wafer substrate has at least one recessed feature and the pre-wetting chamber is configured to deliver pre-wetting fluid onto the wafer substrate in a gaseous from, the pre-wetting fluid condenses to form a liquid film on the wafer surface that fills the recessed feature with the pre-wetting fluid. FIG. 3 depicts an embodiment of a pre-wetting chamber that is configured for such a condensation pre-wetting process. FIG. 3 shows chamber 601 that has a moveable vacuum lid (alternatively an access door) 609 allowing access to the chamber, a line to a vacuum source 611, a vacuum release line 613, and a condensable fluid inlet 615. Vacuum seal 617 seals the lower vacuum containment vessel 619 from the rest of the chamber. The wafer 603 sits on a wafer cooling element (chiller) 605 that is part of the wafer holding fixture (chuck) 607. The wafer cooling element 605 reduces the wafer substrate surface temperature to a temperature below the condensation temperature of the pre-wetting fluid that flows into the chamber thorough inlet 615 as a vapor. In another embodiment, after creating a vacuum and removing the condensable gasses (e.g., air) from the chamber 601 with vacuum, water is simply heated and allowed to vaporize (i.e., boil) in the chamber, and allowed to condense on the surfaces, including and preferentially on the cooler wafer 603, inside the chamber. For example, in a chamber without vacuum seals 617, a small amount of water in the lower section 619 of the chamber could be heated and allowed to flash simultaneously while vacuum is pulled inside the chamber. The connection to the vacuum can be removed (closed) at some point during the process.

Figure 4:
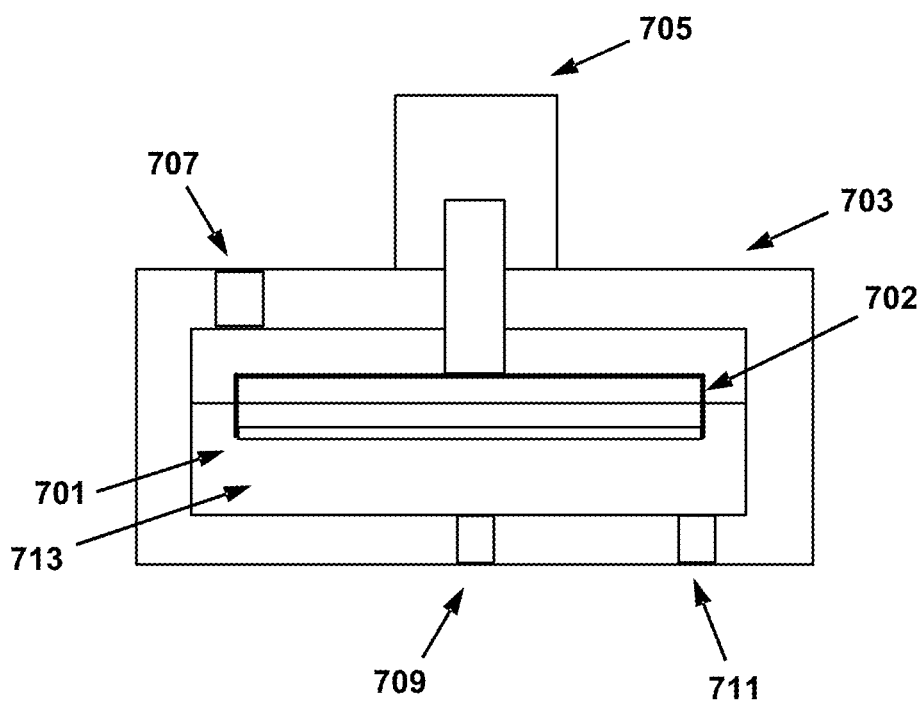
FIG. 4 depicts an embodiment of a pre-wetting chamber configured for an immersion pre-wetting process.

In another embodiment, the wafer substrate is immersed into a bath of pre-wetting fluid for a period of time. FIG. 4 depicts an embodiment of a pre-wetting chamber configured for such an immersion pre-wetting process. In FIG. 4, the wafer 701 is held in wafer holder 702 in a chamber 703. Chamber 703 has an inlet 711 for admitting pre-wetting fluid. As shown, the wafer is held in the wafer holder face up, and held by an appropriate mechanism that still allows fluid to reach wafer from the peripheral edge. Vacuum is pulled on chamber 703 though vacuum port 707, which is connected to a vacuum system (not shown). Then, the wafer is wetted with a pre-wetting fluid by, for example, either 1) the wafer and wafer holder moving down into the pre-wetting fluid 713 or 2) the pre-wetting fluid level rising by fluid entering through inlet 711. During the pre-wetting process, the wafer may be slowly rotated with motor 705. After the pre-wetting process, the liquid level is lowered, or the wafer raised, and the wafer is spun at low rpm with motor 705 to remove excess entrained fluid, leaving a thin pre-wetting fluid layer. A flow of nitrogen gas through port 709 may also be used to dry the backside of the wafer while the frontside of the wafer remains wetted. The wafer is then transferred to a standard clamshell for plating.

In other embodiments of the pre-wetting chamber shown in FIG. 4, the wafer can be held in a face down position. In some embodiments of a pre-wetting apparatus with a pre-wetting chamber as shown the FIG. 4, the pre-wetting apparatus is configured to initiate immersion of the wafer into the pre-wetting fluid after the pressure in the chamber has been reduced to less than about 50 Torr. The pre-wetting chamber 703 shown in FIG. 4 can be used in embodiments in which an external pressure is applied to dissolve bubbles, as described herein. The chamber and other components would need to withstand internal pressures instead of or in addition to vacuum.

Figure 5:
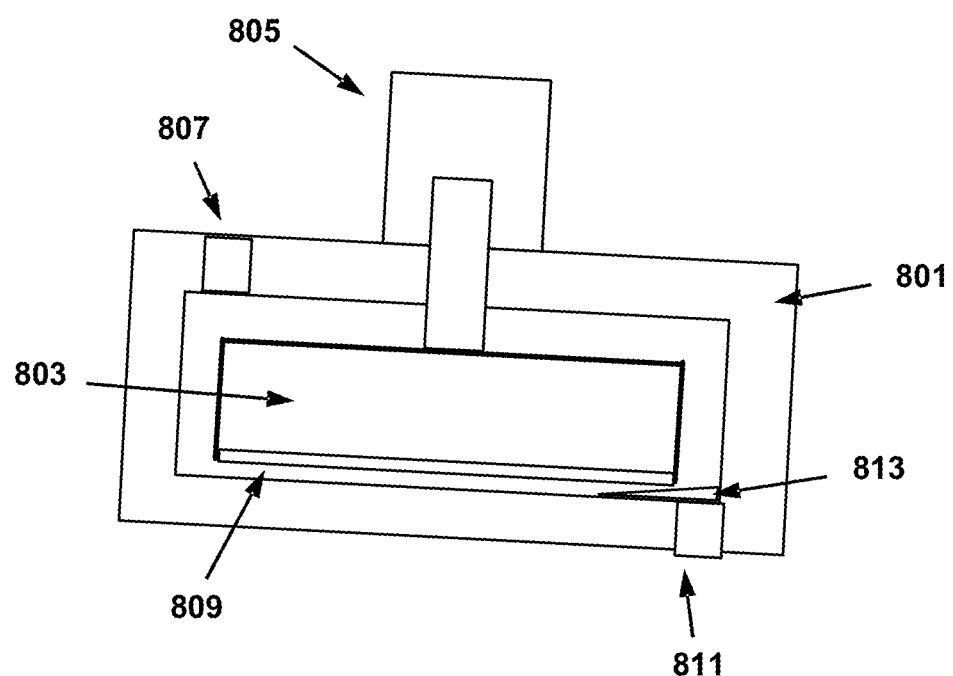
FIG. 5 depicts another embodiment of a pre-wetting chamber configured for an immersion pre-wetting process.

FIG. 5 depicts another embodiment of a pre-wetting chamber configured for an immersion pre-wetting process. FIG. 5 shows pre-wetting chamber 801, wafer 809, and fluid 813 or wafer holder 803 moving relative to each other. In this embodiment, the chamber and wafer holder 803 can be tilted for precise control of the pre-wetting front and complete liquid removal from the chamber. Also, the gap between the wafer 809 and the bottom of the chamber is small. As in FIG. 4, pre-wetting fluid in FIG. 5 may enter/exit though port 811 and a vacuum may be pulled on chamber 801 though vacuum port 807, which is connected to a vacuum system (not shown). Excess entrained fluid may be removed from the wafer surface by spinning it at a low rpm with motor 805. The embodiment shown in FIG. 5 is particularly useful when pre-wetting the wafer substrate surface with a high-cost pre-wetting fluid, or when it is otherwise desirable to use a minimal amount of pre-wetting fluid (e.g., so the level of dissolved gas can be maintained at low levels). After pre-wetting, the wafer is transferred to a standard clamshell for plating. A similar design of a narrow-gap, tilted surface pre-wetting apparatus, but without a mechanism for applying a vacuum during the pre-wetting operations, is described in U.S. Pat. No. 7,690,324, issued on Apr. 6, 2010, herein incorporated by reference.

The chamber shown in FIG. 5 can also be used in the embodiment in which an external pressure is applied, as described above. In this embodiment, the chamber and other equipment is designed or modified to be able to withstand and maintain internal positive pressures.

Figure 6:
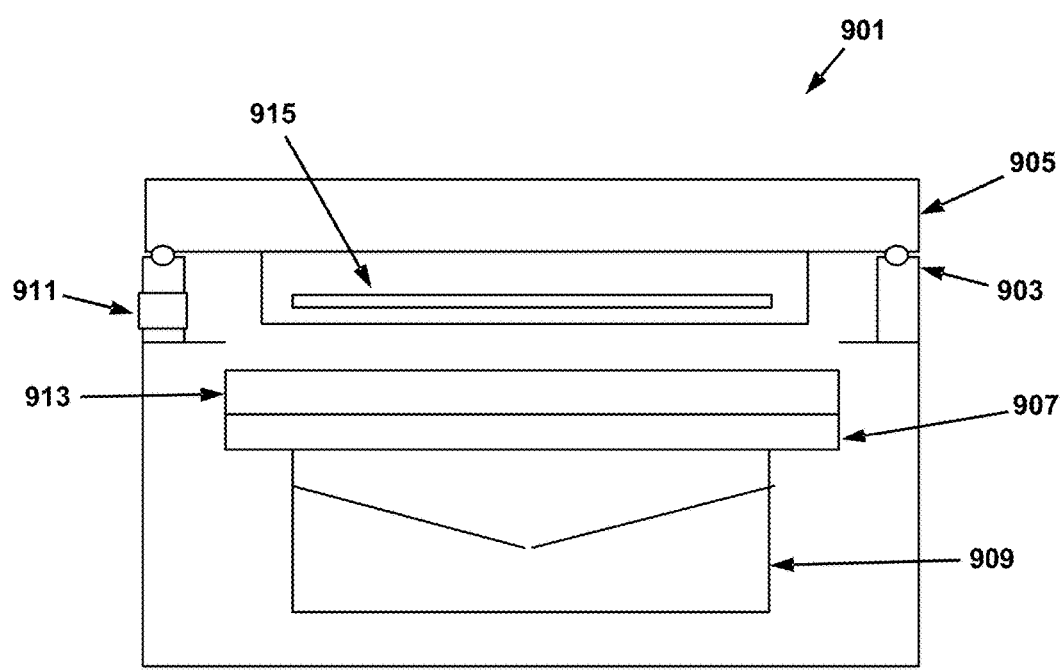
FIG. 6 depicts an embodiment of an apparatus in which the pre-wetting process is performed in a plating cell.

An embodiment of an apparatus in which the pre-wetting process is performed in a plating cell is shown in FIG. 6. Alternatively, this can also be stated that the pre-wetting chamber is configured to both pre-wet a wafer substrate and to electroplate a layer of metal on the pre-wetted wafer substrate. In FIG. 6, chamber 901 is a plating cell, with a vacuum sealing surface being a section of the cell wall 903. Wafer holding fixture 905 holds wafer 915. In the embodiment depicted in this figure, the plating cell contains an ionically resistive ionically permeable high resistance virtual anode (HRVA) 907 and a separated anode chamber (SAC) region 909. One example of an HRVA containing apparatus is described in U.S. Pat. No. 8,308,931, issued Nov. 13, 2012, which is incorporated herein by reference in relevant part. See also U.S. Pat. No. 7,854,828, issued Dec. 21, 2010, which is incorporated herein by reference in relevant part.

Initially wafer 915 is held above the plating solution 913 and the vacuum is drawn on the chamber through vacuum port 911. When vacuum is drawn on the chamber, vacuum typically should be drawn on the backside of the wafer through the wafer holding fixture so that the wafer does not fracture. Afterwards, the fluid level 913 is raised, wetting the wafer surface. In some embodiments, this fluid is pre-wetting fluid, and in other embodiments, this fluid is a plating solution. In some embodiments, the fluid is degassed prior to contacting the wafer surface. Since there is no gas in the chamber, the fact that the wafer is face down does not lead to any trapped gas-containing bubbles below the surface or inside the vias. After the pre-wetting is complete, the vacuum can be released. Electroplating a metal (in some embodiments, copper) on wafer 915 can then begin. It is generally simpler (mechanically and processing conditions) to perform plating at ambient pressures, with or without wafer rotation. Alternatively, the vacuum can be held throughout the electroplating process. Again, it is advantageous in this and other embodiments to have the fluid degassed prior to performing the pre-wetting operations. Otherwise the fluid may release dissolved gas, forming bubble inside the features or on the surface as gas is driven out of the liquid by the lower pressure.

A general description of a clamshell-type plating apparatus having aspects suitable for use with embodiments described herein is described in detail in U.S. Pat. Nos. 6,156,167 and 6,800,187, which are incorporated herein by reference for all purposes.

Figure 7:
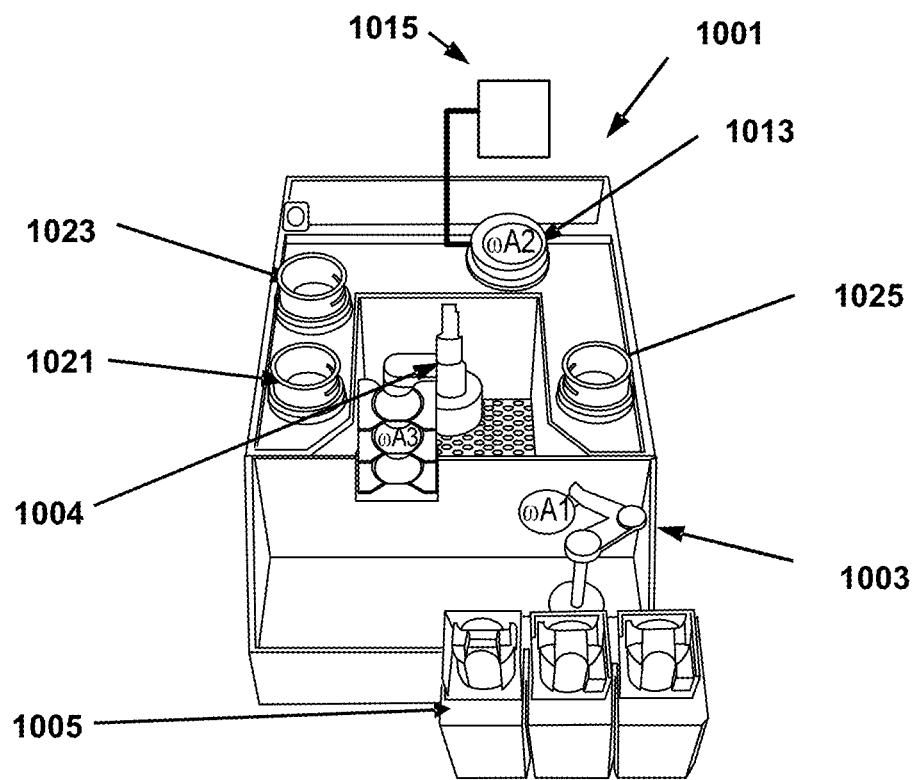
FIG. 7 depicts an embodiment of an electroplating system.

FIG. 7 depicts an embodiment of an electroplating system/module 1001 for processing wafers. The particular tool layout shown contains two separate wafer handling robots, 1003 which moves a "dry" wafer from a cassette stationed in a front FOUP (front opening unified pods) loader 1005 to an aligner module/transfer station (not shown) and a transfer chamber robot 1004. The aligner module ensures that the wafer is properly aligned on a transfer chamber robot 1004 arm for precise delivery to other chambers/modules of the system. In some embodiments, the aligner module both aligns the wafer azimuthally (so called "wafer notch aligning") as well as in the vertical and horizontal planes to a particular location (i.e., fixes the wafer's x, y, and z position registry).

The same or a different transfer chamber robot is used to feed the wafer back from the back end "wet processing area" of the tool to the FOUP after processing and drying is completed. A back end robot (not shown) may contain two or more arms, each with a single or multiple "end-effectors" to grip the wafer. Some "end-effectors" grip the wafer at the bottom of the wafer with a vacuum "wand", and others may hold the wafer only at is peripheral edge. In some embodiments, one robot wafer handling arm end-effectors is used only for handling a wafer that has a wet surface, and the others reserved for handling only fully dry wafers, thereby minimizing contamination.

After a wafer enters the transfer station (containing transfer chamber robot 1004), the wafer typically is fed to a pre-wetting chamber 1013 (i.e., a pre-wetting apparatus is a station in a module, the module further including an electroplating station configured to electroplate the wafer with a metal, the metal being copper in some embodiments), the various embodiments of which are described herein. In other embodiments, system 1001 is configured for an anodic process. In such embodiment, the module further includes a station configured for an anodic process, such as electroetching or electropolishing.

The pre-wetting chamber 1013 is either configured to pre-wet a wafer under vacuum or to apply pressure to a wetted wafer, and in some embodiments, both. Using a pre-wetting chamber configured to pre-wet a wafer under vacuum as an example, ambient air is removed from the chamber while the wafer is spun. Once vacuum is achieved, the device side of the wafer is exposed to degassed pre-wetting fluid (degassed in module 1015 with a degassing flow loop). After wetting is complete, excess fluid is removed, gas is reintroduced to the chamber to atmospheric pressure, and the chamber is opened to allow the wafer to be extracted by the robot or other transfer mechanism. In some embodiments, the transfer mechanism is configured to transfer the pre-wetted wafer substrate from the pre-wetting station to an electroplating station in less than about one minute.

In some embodiments, the wafer is then placed into an aligner (not shown), such as a notch aligner. By passing though a high-accuracy notch aligner, accurate placement into a edge sealing plating cell, which excludes plating solution from the back and the very small device side edge exclusion region (e.g., about 1 mm from the edge), is possible. The plating cell may be specially designed to have a seal that traverses the notch area. Plating and feature filling (i.e., a layer of metal is electroplated on the wafer substrate) occurs in plating cell 1021, 1023, or 1025, (i.e., electroplating stations) and in some embodiments, the plating solution is a degassed solution. In some embodiments, the metal is copper. The electroplating stations are configured to immerse the wafer in a degassed plating electrolyte in the electroplating station. In some embodiments, an electroplating station is configured to cathodically polarize the wafer substrate before immersing the wafer substrate in a degassed plating electrolyte. The plating solution can be recycled though a separate degassing loop different from a flow loop between a main plating bath and the plating sell, or by passing though the degassing element in the same loop as the bath/plating cell loop, being degassed just prior to entering the plating cell.

After plating is completed the wafer is rinsed with water above the plating cell and spun to remove excess entrained fluid, the wafer holding clamshell apparatus is opened releasing the edge seal and allowing wafer extraction. The wafer is then transferred to a post treatment module where the wafer is rinsed and dried.

One concern with the pre-wetting process is that in the time between pre-wetting and plating (i.e., after exposing the wafer to pre-wetting fluid while under vacuum in a pre-wetting chamber but before plating commences), it is possible to have the wafer surface "de-wet". Dewetting may be described as a physical draining and coagulation of the pre-wetting fluid from the surface (i.e., rather than a drying of the surface), leaving one section of the surface with a thicker film of pre-wetting fluid, and another section with no pre-wetting fluid thereupon. This characteristic behavior is generally associated with a highly hydrophobic surface with respect to the pre-wetting fluid. If the wetting layer pulls back or coagulates from a previously wetted surface, then the attributes of the pre-wetting process are lost. To avoid this phenomenon, wetting agents can be added to the pre-wetting fluid to avoid the pooling of the fluid into puddles.

In some embodiments, operations in a pre-wetting chamber or a pre-wetting chamber that is part of an electroplating system are controlled by a computer system. The computer includes a controller including program instructions. The program instructions may include instructions to perform all of the operations needed to pre-wet a wafer substrate. In one embodiment, the instructions are for reducing pressure in the process chamber to a subatmospheric pressure and subsequently contacting the wafer substrate with the pre-wetting fluid at a subatmospheric pressure to form a wetting layer on the substrate surface. The wafer substrate may be rotated at a first rotation rate during delivery of a liquid pre-wetting fluid onto the wafer substrate at a subatmospheric pressure, the fluid delivery being performed for between about 10 to 120 seconds. Then, delivery of the pre-wetting fluid is stopped. After stopping the delivery of the pre-wetting fluid, the wafer substrate is rotated at a second rotation rate to remove excess surface entrained pre-wetting fluid from the wafer substrate. In some embodiments, the vacuum in the process chamber is released after the delivery of the pre-wetting fluid is stopped and prior to removal of the excess entrained pre-wetting fluid. In alternative embodiments, the vacuum is released after removal of the excess entrained pre-wetting fluid. The wafer may be rotated at different rates in different embodiments. In some embodiments, the first rotation rate during delivery of a liquid pre-wetting fluid onto the wafer substrate is less than about 300 rpm and the second rotation rate to remove excess entrained pre-wetting fluid from the wafer substrate is at least about 300 rpm. In other embodiments, the first rotation rate is about 100 rpm or less, and the second rotation rate is at least about 500 rpm. In yet further embodiments, the pre-wetting apparatus is configured for removing excess entrained pre-wetting fluid from the wafer substrate by a method selected from the group consisting of centrifugal spinning, air-knife drying, and wiping and the controller includes program instructions for performing these operations.

Process/Method

In a general pre-wetting method for some embodiments disclosed herein, a vacuum is first created in the environment around the wafer. Then, the wafer surface is sprayed with, streamed with, covered with, or immersed in sufficient (in some embodiments, degassed) pre-wetting fluid, eventually exposing the entire wafer to a sufficiently thick liquid layer. The layer may not cover the entire surface at all times, until later in the process. The wafer surface is then left immersed or otherwise exposed to a pre-wetting fluid layer for a period of time (e.g., by continuing to spray, stream, cover, or immerse the surface with additional fluid) until adsorption (or reaction) of any pre-wetting fluid constituents at the wafer surface have substantially reached completion/equilibrium and a favorable/uniform wetting character (hydrophilicity, low contact angle) is achieved. After pre-wetting, the spraying, streaming, or covering of the wafer with pre-wetting fluid is stopped. In some embodiments, vacuum is released and then excess entrained fluid is removed from the (now) completely hydrophilic surface (e.g., by centrifugal spinning, air-knife drying, squeegee wiping, etc.), leaving a thin uniform adherent layer of pre-wetting fluid on the surface. In other embodiments, excess entrained fluid is removed before releasing vacuum. Finally, the wafer is transferred to plating cell to plate the wafer.

Because there may be anywhere from a few seconds to over a minute between the time that entrained pre-wetting fluid is removed from the wafer surface to the initiation of metal deposition, it is important that the wafer is globally hydrophilic and remain completely coated with fluid over the entire surface. In the ensuing time, a hydrophobic surface/fluid combination can lead to the fluid receding from, and uncovering a portion of, the wafer surface, for example, starting from the wafer edges. This de-wetting may cause the fluid to be drawn out from within any recessed features within the wafer substrate, possibly leading to gas being trapped within the feature on immersion into the plating bath. Hydrophobic surfaces, particularly those that have completely de-wetted in some regions, have non-uniform fluid pre-wetting layer thickness over the wafer substrate. In the case that the pre-wetting fluid in use has a different composition than the plating bath, the subsequent immersion of the pre-wetted wafer into the plating solution will not allow for a uniformly wetted surface if the pre-wetting fluid has not wetted the wafer properly. The non-uniformly wetted wafer will cause the diffusion times and concentrations of various components to be different across the wafer's surface due to the thickness of the wetted layer. This can lead to variation in feature filling behavior or the creation of various wafer surface defects, such as lines of entrapped bubbles, metal pits, metal thickness variations, or growth protrusions. Therefore, after the pre-wetting process, the pre-wetting fluid should create a uniform, small contact angle with respect to the entire wafer surface, for example, a contact angle of about 45 degrees or less, if possible. When a lower contact angle is possible, a very thin and adherent pre-wetting fluid layer can be created.

It is often observed that the contact angles of a surface can change with time, and that hydrophobic surfaces may become more hydrophilic over time when exposed to certain liquids. Certain wafer surfaces, such as those coated with copper films by, for example, plasma vapor deposition, can exhibit a significant decrease in the liquid/surface contact angle with time upon continuously exposing the surface to the pre-wetting fluid. In particular, the continual exposure of such a surface, while under vacuum conditions, can lead to rapid and complete transformation of the surface from a generally de-wetted, hydrophobic state, to a wetted, hydrophilic state.

By applying a degassed pre-wetting fluid to the surface while simultaneously maintaining a low pressure/vacuum atmosphere, the impediment of simultaneously expanding, flushing, or otherwise removing trapped gas from the surface is substantially eliminated, and so the impediment of exposing areas of the wafer that are still hydrophobic due to no or limited previous exposure to the pre-wetting fluid may be reduced. Considering the process without employing the vacuum and wetting combination, the various regions of the wafer surface will fall into 5 wetted categories: 1) Hydrophobic Wetted: Covered with and wetted with pre-wetting fluid but for an insufficient time, so it is still hydrophobic; 2) Hydrophilic Wetted: Covered with and wetted with pre-wetting fluid for a sufficient time, so it is has become hydrophilic; 3) Un-wetted: Hydrophobic, exposed to air, and never exposed to pre-wetting fluid; 4) De-wetted: Previously wetted, but having become de-wetted, and again exposed to air; 5) Trapped Bubble: Containing a bubble containing trapped air at the surface and under a layer of pre-wetting fluid.

It is important to note that an area in state 3, 4, or 5 will not undergo any adsorption or chemical reaction, leading to the absence of any hydrophobic-to-hydrophilic surface transformation unless and until that region later becomes wetted. Furthermore, areas around state 3 that are in state 1 or 2 are wetted and are or will become hydrophilic, allowing fluid to flow freely and continuously over this surface and making the removal of the bubble or wetting of adjacent surfaces considerably more difficult. Also, a currently hydrophobic surface region, having previously been exposed to pre-wetting fluid, may repeatedly go between the states of liquid-coverage-free and covered but hydrophobic. The process continues converting between these states as fluid wicks away to adjacent hydrophilic area, oscillating back and forth from state 1 to state 3 multiple times, until eventually it either it i) changes to state 2 and becomes hydrophilic and wetted, thereafter stays in state 2, or ii) become surrounded by areas that are more wetting, encapsulates a bubble, and transforms to state 4.

The above processes, performed under atmospheric conditions (i.e., in air), should be contrasted with processes performed under vacuum (and with degassed pre-wetting fluid). In these processes, there are only three wetted categories that exist: 1) Wetted: Covered and wetted with pre-wetting fluid; 2) Un-wetted: Exposed to vacuum and never exposed to pre-wetting fluid; 3) De-wetted: Previously wetted, but having become de-wetted and re-exposed to vacuum.

A pre-wetting process performed under vacuum ensures that, as long as a particular part of the wafer has been exposed to pre-wetting fluid (state 1) for sufficient time, the particular part of the wafer will eventually become hydrophilic. Unlike a pre-wetting process performed in atmosphere, a high fluid velocity pre-wetting fluid stream is not required to "flush away" trapped bubbles. Furthermore, bubble flushing is not 100% effective, and will often lead to bubble fragmentation, leaving a large number of smaller, hard to remove bubble behind. Hence, pre-wetting under vacuum is a much more reliable low defect process over simply spraying, covering, or immersing the wafer into a pre-wetting fluid under atmosphere. Other factors that favor pre-wetting under vacuum are that a) surface energies of the vacuum/liquid/metal interface are different and the contact angle is often lower than the air/liquid/metal interface, b) metal oxide/nitride/carbonate reformation is avoided, and c) using degassed fluid prevents the possibility of gas precipitating out of the fluid, for example, as a result of a spurious temperature or pressure change at some points at the liquid-wafer interface.

Figure 8A:
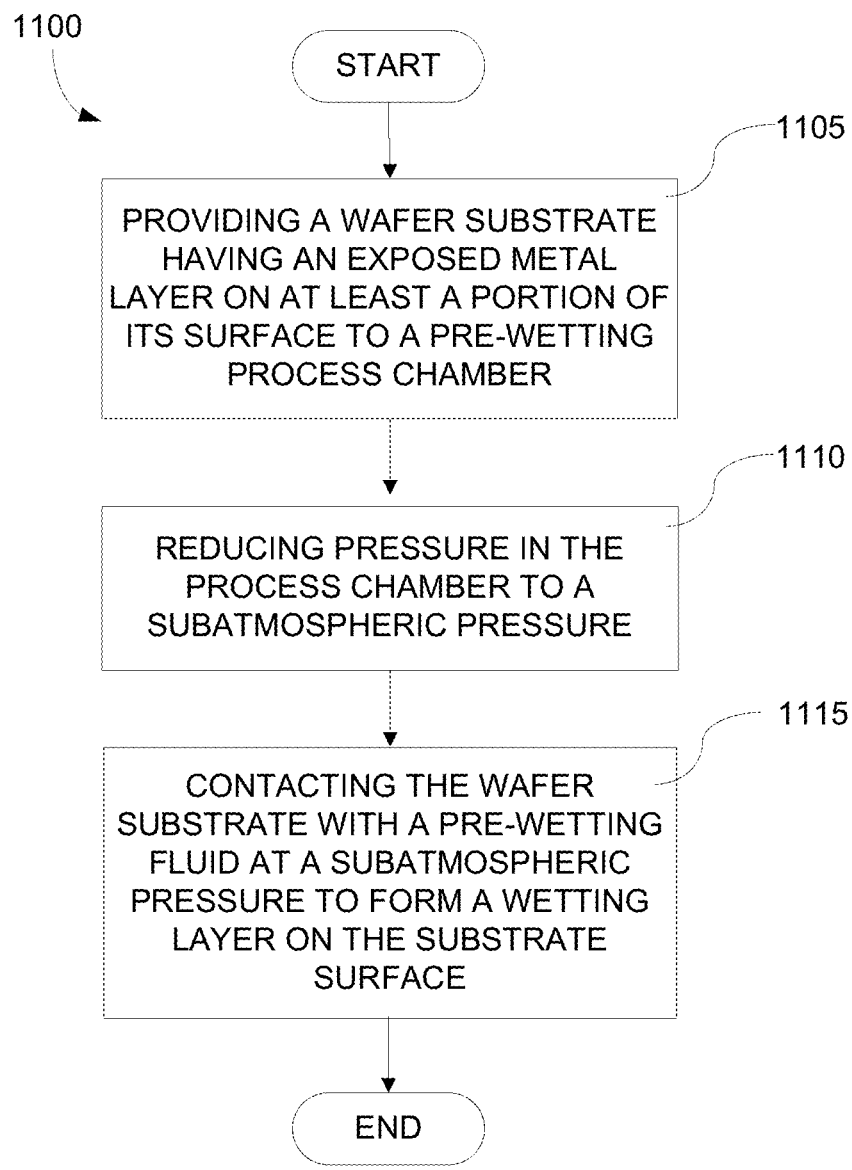
FIGS. 8a and 8b are flow diagrams for embodiments of a pre-wetting process.

FIG. 8a is a flow diagram for a general embodiment of a pre-wetting process (1100). A wafer substrate having an exposed metal layer on at least a portion of its surface is provided to a pre-wetting process chamber (1105). The pressure in the process chamber is then reduced to a subatmospheric pressure (1110). The wafer substrate is then contacted with a pre-wetting fluid at a subatmospheric pressure to form a wetting layer on the wafer substrate surface (1115). Such a pre-wetting process can be preformed in the pre-wetting apparatus designs described herein. The wafer substrate has different features in different embodiments. The wafer substrate may have at least one recessed feature. The recessed feature may be a damascene feature, which are formed by damascene patterning processes. A damascene plating process is a process in which a recess in a dielectric layer of a semiconductor wafer formed by a damascene patterning process is filled with a metal film. A recessed feature may also be a though-mask feature.

In some embodiments, the pre-wetting fluid is substantially free of dissolved gases. In some embodiments, one or more dissolved gases are removed from the pre-wetting fluid prior to contacting the wafer with the pre-wetting fluid. To aid in removal of dissolved gases, in some embodiments, the pre-wetting fluid is cooled to less than about 20° C. during removal of the gases. To remove gases from a pre-wetting fluid to obtain, in some instances, a pre-wetting fluid that is substantially free of dissolved gases, a pre-wetting fluid treatment tank has the pre-wetting fluid circulating for a specific time period (typically ½ an hour, depending on the capabilities and capacity of the degasser) though a degassing loop before contacting the wafer substrate with pre-wetting fluid. This is discussed herein with respect to FIG. 1. Typically this implies that fluid is flowing through the loop while the vacuum pump is on and at vacuum, and the valve connecting the degasser and to the pre-wetting tank to the pump is open. This ensures that the pre-wetting fluid that is subsequently applied to the wafer surface is substantially free of dissolved gases. Measurements of a system so designed shows residual levels of dissolved oxygen reaching as little as about 1-2% or less of that saturated with oxygen from air.

Furthermore, dome and wall heaters on the process chamber may be turned on, set to a temperature of about 10° C., and in some instances about 20° C. or greater, than that of the pre-wetting fluid temperature. For example, if the fluid temperature is about 20° C., a wall temperature of about 40 to 50° C. is appropriate. Dome and wall heaters avoid condensation on the surfaces and the potential for liquid droplets falling onto the exposed surface prior to pre-wetting under vacuum. A purge of the chamber surfaces can be accomplished by bringing the chamber to vacuum with the door closed and the walls at the target heated temperature. For example, without a wafer present in the chamber and the walls heated, the chamber is brought to vacuum and remains at vacuum for about 10 minutes or more, so as to remove any liquid which might have accumulated on the chamber ceiling and upper walls. The vacuum can be removed by backfilling with, for example, clean dry nitrogen. This procedure removes any possible condensate from the chamber walls and minimizes the formation of gas born particles. After confirming that a) all chamber fluid level sensors are at appropriate values (e.g., tank full, chamber empty), b) the heater is on, and c) the vacuum is ready for processing, the pre-wetting chamber process door can be opened and the door shield (if so equipped) dropped. Next, a wafer is placed into the chuck and the robot arm is retracted, the vacuum door is closed, and the liquid splash shield is raised or the wafer lowered below the shield (if so equipped).

A target level of vacuum for the pre-wetting process in some embodiments is between about 10 and 100 torr, for example about 40 torr. In some embodiments, the vacuum (i.e., subatmospheric pressure) is about 50 torr. In some embodiments, after pump down is complete, the vacuum line can be closed, while in other embodiments, the pump continues to pull a vacuum while pre-wetting fluid is injected into the chamber and onto the wafer.

In some embodiments, a liquid pre-wetting fluid is delivered onto the wafer substrate surface. This may entail immersing the wafer substrate in the pre-wetting fluid. Alternatively, this may entail spraying or covering the wafer substrate with the pre-wetting fluid. In other embodiments, contacting the wafer substrate with a pre-wetting fluid is performed by delivering a gaseous pre-wetting fluid onto the wafer substrate. The gaseous fluid is allowed to condense and form the wetting layer on the wafer substrate. In these embodiments, the temperature of the wafer substrate may be reduced below the condensation temperature of the pre-wetting fluid before exposing the wafer substrate to the pre-wetting fluid.

In some embodiments, the wafer may be rotated while a liquid pre-wetting fluid is delivered onto the wafer substrate surface. In some embodiments, the wafer substrate is rotated at a rate of between about 10 rpm to 300 rpm. In further embodiments, the wafer substrate is rotated at a rate of between about 10 rpm to 100 rpm. In other embodiments, the wafer substrate is spun at speed of from about 100 to 400 rpm, for example at about 300 rpm. In some cases a higher rotation rate (e.g., about 400 to 800 rpm), or a cycling of rotation rate, with periodic accelerations and decelerations of the wafer, may be used for a short time (about 2 to 10 seconds) where overcoming fluid wetting resistance of a highly hydrophobic wafers is an issue. Chamber pump down may be initiated before or after wafer rotation is started.

In embodiments where a liquid pre-wetting fluid in used, flow of the pre-wetting fluid is initiated into the chamber and onto wafer surface. A typical flow rate of between about 0.5 and 2 lpm, for example, about 0.8 lpm, is used, for between about 3 seconds and 1 minute or more, for example, for about 20 seconds, depending on the necessary time to achieve full wetting of a particular surface, rotation rate of the wafer, and the wetting properties of the fluid. In some embodiments, the pre-wetting fluid is contacted with the wafer substrate from about 10 second to 120 seconds. After the wetting process is complete, the pre-wetting fluid flow is stopped, for example, by closing a pre-wetting fluid flow valve.

Next, the chamber is brought to an atmospheric pressure. In some embodiments, the chamber is brought to an atmospheric pressure with an oxygen-free gas, e.g., dry nitrogen.

In some embodiments, excess pre-wetting fluid is removed from the substrate surface. This can be done before or after bringing the chamber to an atmospheric pressure. In some embodiments, excess pre-wetting fluid is removed from the wafer substrate surface by rotating the wafer substrate. The wafer substrate rotation rate is increased to a value where excess entrained fluid can be removed from the wafer substrate surface, but a thin layer of liquid remains. The wafer substrate may be rotated from about 300 rpm to 1000 rpm during removal of the excess pre-wetting fluid. The wafer substrate may be rotated less than about 20 seconds during removal of the excess pre-wetting fluid. In other embodiment, the wafer substrate rotation rate is increased to between about 250 and 800 rpm for between about 5 and 60 seconds, while avoiding the complete drying of the pre-wetting fluid. While the rotation process generally can be initiated prior to the release of vacuum, by performing this step after the release of vacuum, it is believed that the potential for the wafer drying is reduced, because the evaporative drying from a thin layer and the possibility of creating a dry surface at some point on the wafer may be less.

After removing the excess entrained fluid from the wafer substrate surface, the wafer substrate rotation is stopped, the splash shield lowered and/or the wafer substrate raised (if so equipped), the vacuum door opened, and the wafer removed from the chamber and placed in an electroplating chamber. In some embodiments, the pre-wetted wafer substrate is exposed to an environment outside of the chamber and the electroplating chamber for less than about one minute. In other embodiments, the pre-wetted wafer substrate has a wetting layer having a thickness of between about 50 to 500 μm immediately prior to electroplating when it is transferred to the electroplating chamber. After the wafer substrate is in the electroplating chamber, the wafer substrate is electroplated using a degassed plating solution, in some embodiments. In some embodiments, the pre-wetted wafer substrate is cathodically polarized with respect to a plating solution before contacting the wafer substrate with the plating solution. The pre-wetting process chamber and the electroplating chamber may be distinct stations of one apparatus module. In other embodiments, the wafer substrate is electroplated in the same chamber than was used for pre-wetting. In these embodiments, the electroplating may be performed using a degassed plating solution.

In alternative embodiments, after removing the pre-wetted wafer substrate from the pre-wetting process chamber, the pre-wetted wafer substrate is transferred to a chamber configured to perform an anodic process such as electroetching and electropolishing.

Figure 8B:
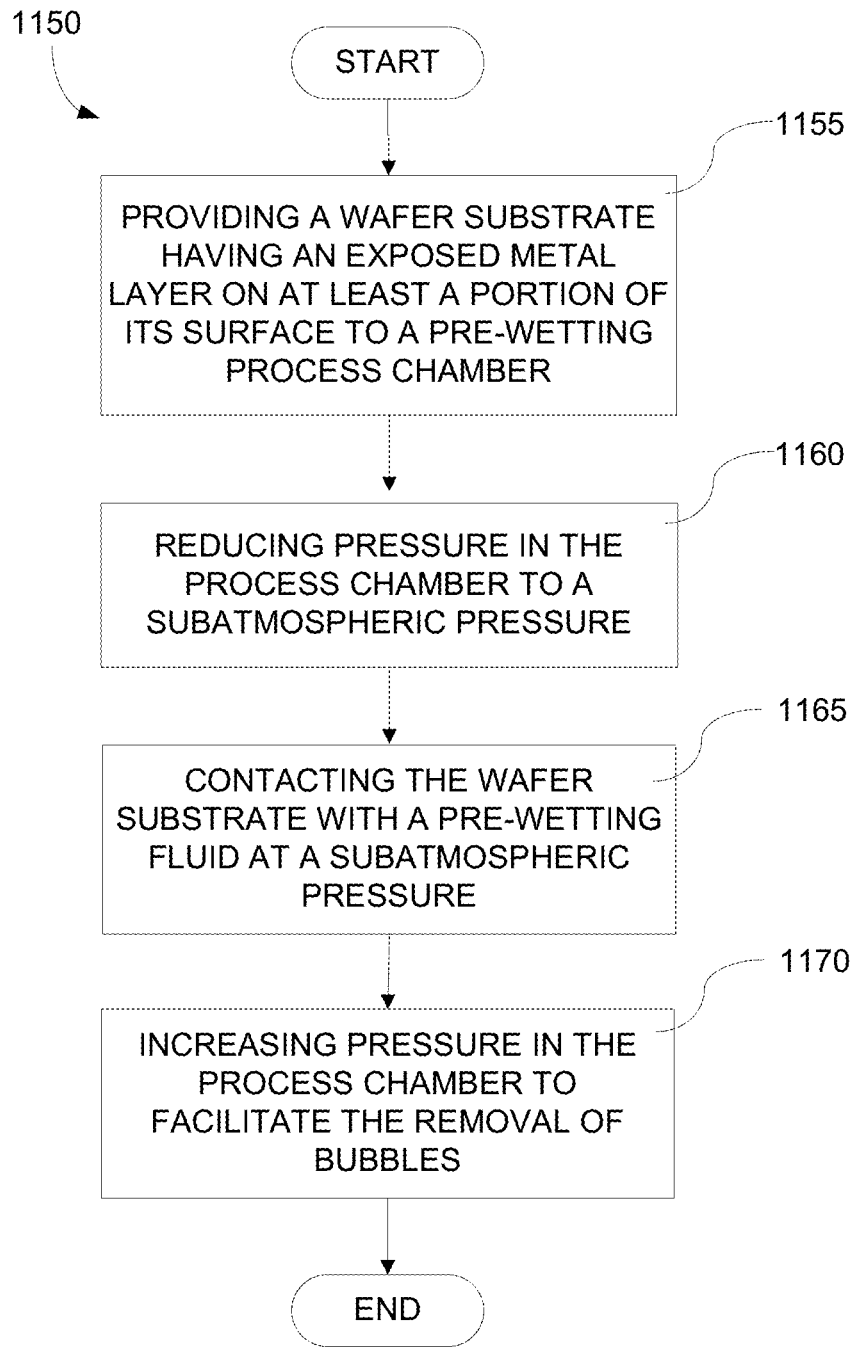

FIG. 8b is a flow diagram for another embodiment of a pre-wetting process (1150). A wafer substrate having an exposed metal layer on at least a portion of its surface is provided to a pre-wetting process chamber (1155). The pressure in the process chamber is then reduced to a subatmospheric pressure (1160). The wafer substrate is then contacted with a pre-wetting fluid at a subatmospheric pressure (1165). The pressure in the process chamber is then increased to facilitate the removal of bubbles (1170). Such a pre-wetting process can be preformed in pre-wetting apparatus designs described herein The apparatus designs and methods described herein may be used to pre-wet a partially fabricated semiconductor device structure. In some embodiments, a pre-wet partially fabricated semiconductor device structure includes at least one recessed feature. The recessed feature has a layer of metal lining the feature. The recessed feature also includes a substantially gas-free pre-wetting fluid filling the feature, the pre-wetting fluid comprising an aqueous metal salt solution substantially free from plating accelerators and levelers.

Figure 9:
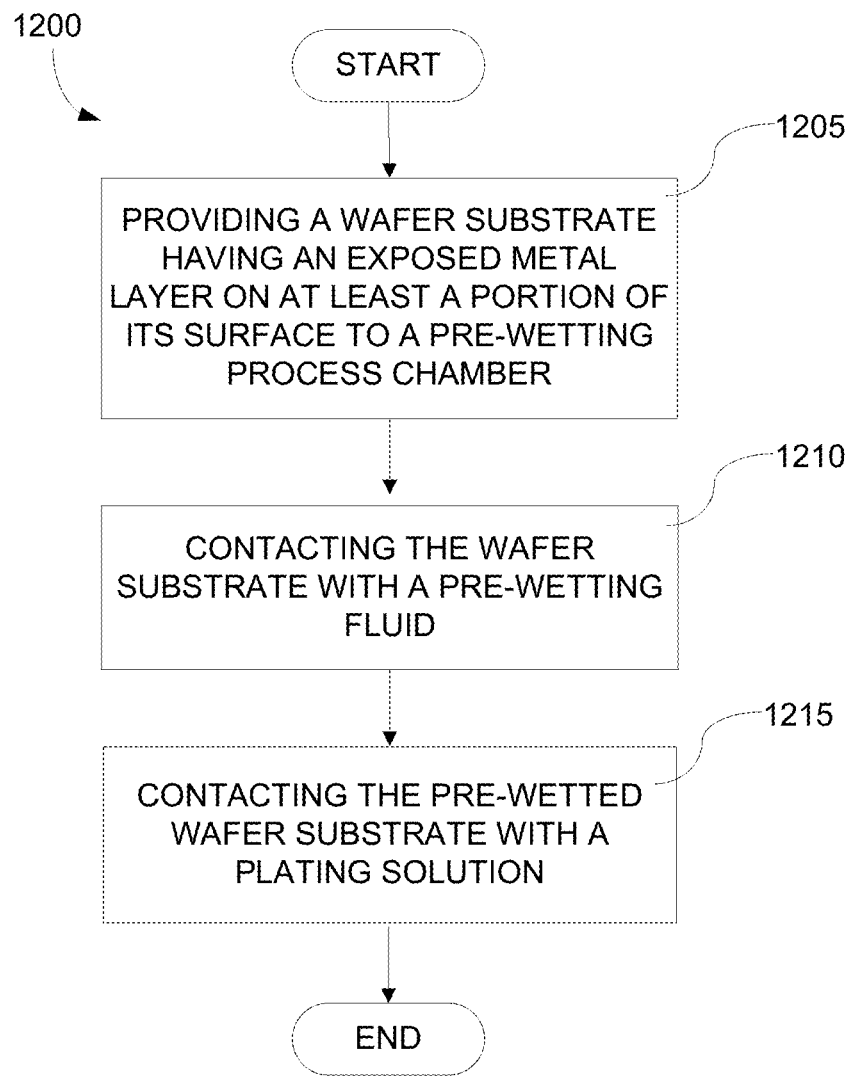
FIG. 9 is a flow diagram for an embodiment of an electroplating process for electroplating a layer of metal on a wafer substrate.

Different combinations of pre-wetting fluid compositions and plating solution compositions can be used in a pre-wetting process combined with an electroplating process, as described herein. FIG. 9 is a flow diagram for an embodiment of an electroplating process 1200 for electroplating a layer of copper on a wafer substrate. A wafer substrate having an exposed metal layer on at least a portion of its surface is provided to a pre-wetting process chamber (1205). The wafer is then contacted with a pre-wetting fluid to form a layer of pre-wetting fluid on the wafer substrate (1210). The pre-wetted wafer is then contacted with a plating solution that includes metal ions to electroplate a layer of metal on the wafer substrate (1215).

The apparatus designs and methods described herein are useful in various other liquid semiconductor processes and circumstances, beyond electroplating/feature filling, where bubbles or trapped gasses within a high aspect ratio feature may pose a problem.

All operations described herein, including the various wetting, pre-wetting, degassing, alignment, transfer, and plating operations, may be configured or programmed in one or more controllers provided on or otherwise in communication with the described modules and systems. Any combination or sequence of such operations, as described herein, may be programmed or configured as such using such controller(s). Firmware, software macros, application specific integrated circuits, shareware, machine-readable media, and the like may be used to implement the controller instructions and may be coupled to the controller(s). Further, the controller(s) may include one or more memory devices and one or more processors configured to execute the instructions so that the apparatus can perform a method in accordance with the disclosed embodiments.

Through Resist Plating Pre-Wetting Apparatus and Process Example

The apparatus designs and methods described above also may be used for through resist plating processes (i.e., plating onto a wafer substrate that includes a photoresist). Through resist plating is a process in which pillars or lines of a metal are formed on a wafer substrate, with the resist being used as a plating template material. For example, in a through resist plating process, a metal seed layer is formed on a surface of a wafer substrate. The seed layer is then coated with a photoresist, the photoresist is exposed to ultraviolet light, and portions of the photoresist are removed in the developing process (e.g., for a positive resist, the portions exposed to the light are removed, and for a negative resist, the portions that are not exposed to the light are removed) to form features in the photoresist. In some embodiments, the features may have aspect ratios of about 2 to 1 to about 1 to 2, or about 1 to 1. In some embodiments, the features in the photoresist have openings having a size of about 5 micrometers to 200 micrometers, about 10 micrometers to 100 micrometers, or about 20 micrometers to 50 micrometers. In some embodiments, lines or paths (e.g., used to form redistribution layers) may be formed in the photoresist.

A descum process, which may include exposure of the wafer substrate to an oxygen plasma, may be performed to remove any residual photoresist from the metal seed layer in the features. A metal is then electroplated onto the metal seed layer in the features. The metal may be electroplated to thickness near the thickness of the resist thickness, in some embodiments. For example, the electroplated metal thickness may be slightly above or slightly below the resist thickness. After electroplating the metal, the photoresist is stripped from the wafer substrate.

In some embodiments, the electroplating process may be preceded by a pre-wetting process. In one example, for a wafer level package, the wafer substrate may be contacted with a pre-wetting fluid, and then a thin nickel layer about 2 micrometers to 4 micrometers thick may be electroplated onto the metal seed layer. A solder alloy such as SnAg, Sn or SnCu may be electroplated onto the thin nickel layer. The photoresist remaining on the wafer substrate is then removed. The metal seed layer remaining on the surface of the wafer substrate (i.e., the metal seed layer not electroplated onto) also may be removed. The pre-wetting apparatus and chambers described above (e.g., with respect to FIGS. 1-6) may be used for forming a pre-wetting layer on a wafer substrate for though resist plating.

In some instances, however, photoresist particulates or residues may be formed and come to rest on the metal seed layer in the features formed in the photoresist. This can be residual material from the developing step or particulates that are generated during the descum step. A photoresist particle/residue on the seed layer may then be plated over, forming a defect in the plated metal. The photoresist particles may be about 2 micrometers to 7 micrometers in size, or about 5 micrometers in size. The photoresist particles/residue may be a fraction of the size of the feature in the photoresist (e.g., a photoresist particle may be about 10% of the size of a feature). The photoresist particles may be formed in the descum process (e.g., by mechanical damage of the photoresist during the descum process), and may adhere to the sidewalls of the features in the photoresist. A pre-wetting process may transfer the photoresist particles/residue to the metal seed layer.

In some embodiments, a pre-wetting chamber may include elements that deliver a pre-wetting fluid at a pressure such that the pre-wetting fluid has a sufficient velocity to remove a photoresist particle/residue from where the particle is attached (i.e., the photoresist surface or the metal seed layer). In certain embodiments, the pre-wetting fluid has velocity components both parallel to and normal to the surface of the wafer substrate. One or both of these components may provide forces sufficient to overcome the forces (e.g., electrostatic and/or frictional forces) holding the photoresist particles to the wafer substrate. In addition to dislodging a photoresist particle, the pre-wetting fluid is delivered to the pre-wetting chamber at a flow rate whereby the dislodged photoresist particles are carried off the surface of the wafer substrate. Photoresist particle/residue removal may be enhanced with higher flow rates of a pre-wetting fluid. As wafer substrates typically include multiple features in the photoresist, a photoresist particle needs to be removed from a feature and transported off of the wafer substrate under conditions that prevent the particle from being trapped by falling into a different feature.

Figure 10A:
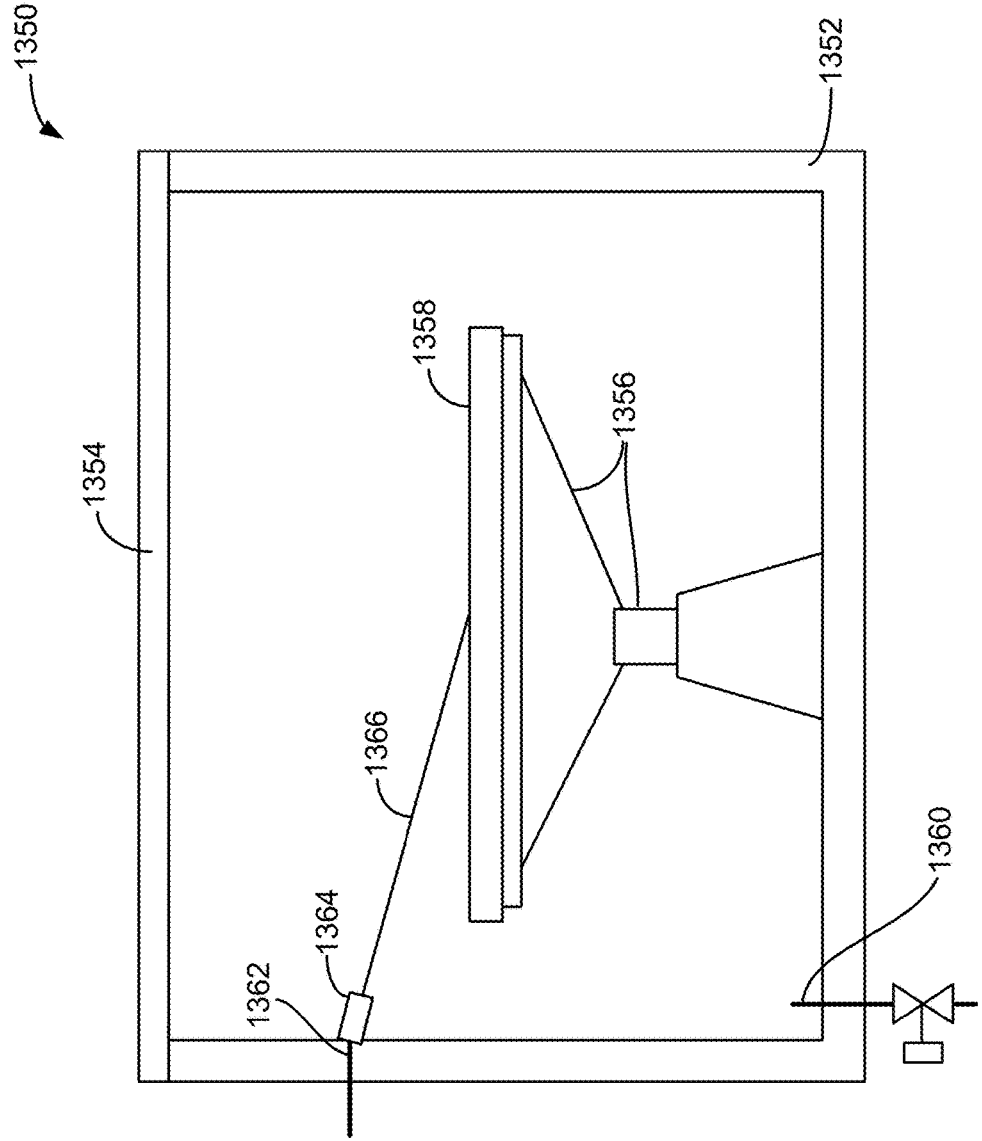
FIGS. 10a and 10b depict an embodiment of a pre-wetting chamber for through resist plating.
Figure 10B:
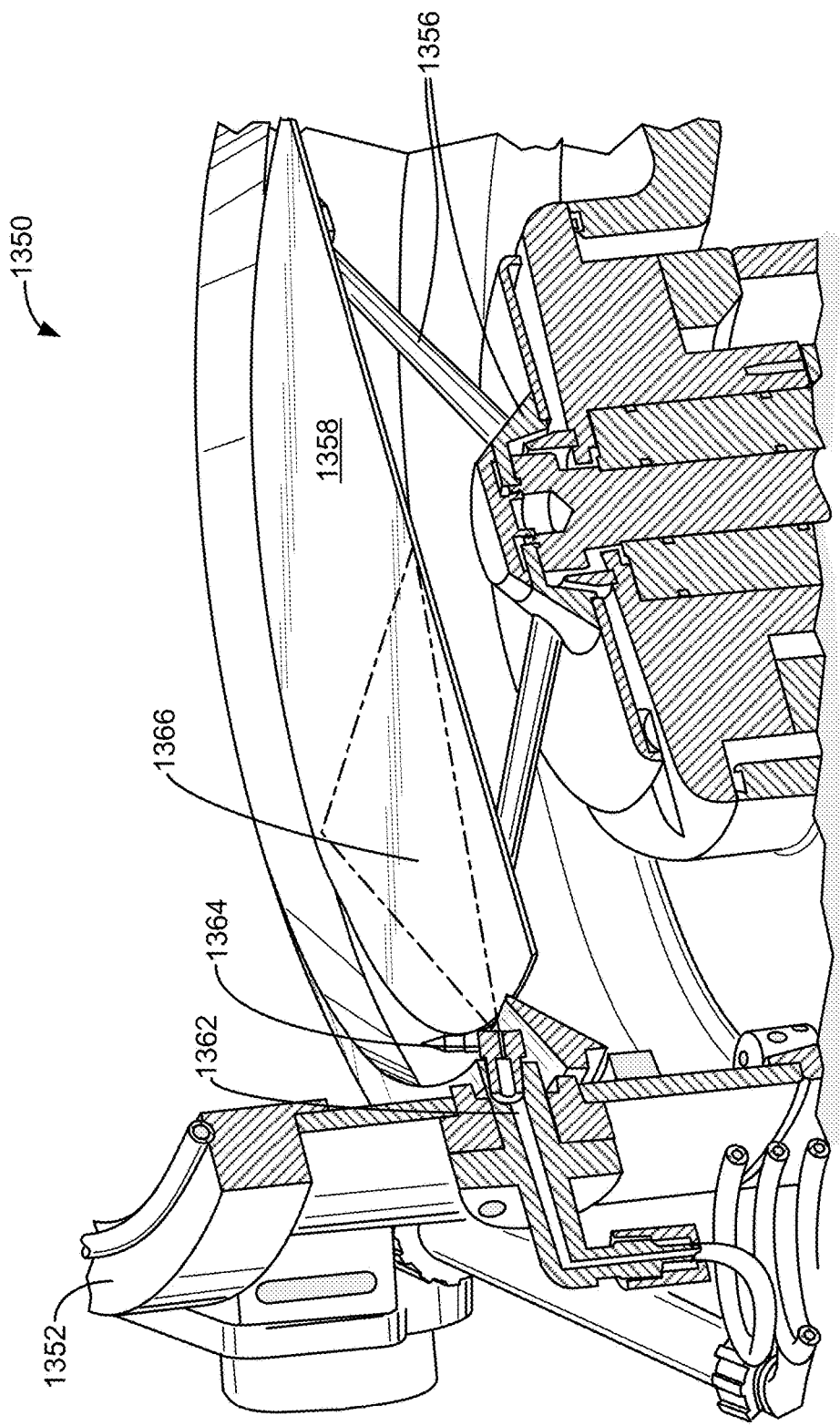

FIGS. 10a and 10b depict an embodiment of a pre-wetting chamber for through resist plating. FIG. 10a shows a cross-sectional view of the pre-wetting chamber, and FIG. 10b shows an isometric projection of an interior portion of the pre-wetting chamber. A pre-wetting chamber 1350 includes a chamber body 1352 and a chamber cover 1354 that form a vacuum seal when in contact with one another. The chamber body 1352 supports a wafer substrate holder 1356 configured to hold a wafer substrate 1358 and configured to rotate the wafer substrate 1358.

The chamber body 1352 further includes a vacuum port 1360 and a fluid inlet 1362. The vacuum port 1360 is coupled to a vacuum pump and configured to allow the formation of a subatmospheric pressure in the pre-wetting chamber 1350. The fluid inlet 1362 is coupled to a degasser (not shown). The degasser is configured to remove one or more dissolved gasses from a pre-wetting fluid to produce a degassed pre-wetting fluid. The fluid inlet is configured to deliver the degassed pre-wetting fluid onto the wafer substrate at a velocity of at least about 16 meters per second (m/s) to dislodge photoresist particles from the surface of the wafer substrate. Further, the fluid inlet is configured to deliver the degassed pre-wetting fluid onto the wafer substrate at a flow rate at least about 0.6 liters per minute (L/minute) such that the dislodged photoresist particles are washed off of and removed from the wafer substrate.

In the depicted embodiment, the fluid inlet 1362 includes a nozzle 1364 mounted to a sidewall of the chamber body 1352. In some embodiments, the nozzle 1364 is a fan nozzle. A fan nozzle may be configured to deliver the degassed pre-wetting fluid onto the wafer substrate such that the degassed pre-wetting fluid impinges the wafer substrate in the shape of a line. FIGS. 10a and 10b show a free flowing line of degassed pre-wetting fluid 1366 from the nozzle 1364 impinging the wafer substrate 1358.

A fan nozzle is a type of fluid nozzle that allows a fluid flow to spread out from the nozzle in the shape of a fan. For example, a fan nozzle having a spray angle of about 40 degrees to 120 degrees, or about 95 degrees in a specific embodiment, may be used for the nozzle 1364. The spray angle is the angle of the fan of fluid produced by the fan nozzle. In certain embodiments, a fan nozzle for use with the pre-wetting chamber 1350 may have an orifice size of 0.04 inches to 0.06 inches, or about 0.05 inches, a flow rate of about 0.6 L/minute to 2.2 L/minute, or about 1.3 L/minute, with a pressure of the nozzle being about 30 pounds per square inch (psi) to 80 psi, or about 40 psi, and a fluid velocity at the wafer surface of about 16 m/s to 31 m/s.

In a pre-wetting operation using the pre-wetting chamber 1350, the pressure in the pre-wetting chamber may be reduced to a subatmospheric pressure prior to forming a wetting layer on the wafer substrate. For example, in some embodiments, forming a wetting layer on the wafer substrate may begin when a pressure in the pre-wetting chamber is reduced to less than about 50 Torr. Before forming the wetting layer and while forming the wetting layer, the wafer substrate may be rotated at a first rotation rate. Then, a wetting layer is formed on the wafer substrate at the subatmospheric pressure in the pre-wetting chamber by contacting the wafer substrate with a degassed pre-wetting fluid from the degasser and admitted through the fluid inlet. In some embodiments, the wafer substrate may be contacted with the degassed pre-wetting fluid for about 10 seconds to 120 seconds.

After forming the wetting layer on the wafer substrate, delivery of the degassed pre-wetting fluid may be stopped. The pressure in the pre-wetting chamber may be increased to atmospheric pressure or to above atmospheric pressure after stopping the delivery of the degassed pre-wetting fluid. Then, the wafer substrate may be rotated at a second rotation rate to remove excess surface entrained degassed pre-wetting fluid from the wafer substrate. In some embodiments, all of the process operations described above may be performed in a pre-wetting process. In some other embodiments, some of the process operations described above may be excluded in a pre-wetting process.

The wafer substrate rotating at a first rotation rate during the pre-wetting process may aid in the removal of photoresist particles from the wafer substrate. For example, the centripetal force exerted on a photoresist particle may aid in transporting a dislodged photoresist particle to the edge of and off of the wafer substrate. The centripetal force exerted on a photoresist particle near the center of the wafer substrate (i.e., near the axis of rotation of the wafer substrate) may not be great, however. Thus, in some embodiments, the pre-wetting fluid is delivered to and impinges the wafer substrate as a line through the center of the wafer substrate (e.g., near the axis of rotation of the wafer substrate) to aid in the removal of photoresist particles from the center of the wafer substrate.

For example, in a pre-wetting operation using the pre-wetting chamber 1350, a wafer substrate may be placed in the pre-wetting chamber and the chamber closed. A vacuum of about 50 Torr to 100 Torr, or about 70 Torr, may be formed in the pre-wetting chamber. The wafer substrate may be rotated at a first rotation rate of about 20 rpm to 800 rpm, or about 80 rpm, while the wafer substrate is contacted with degassed pre-wetting fluid from about 5 seconds to 90 seconds, or about 10 seconds, at a flow rate of about 0.6 L/minute to 2.2 L/minute, or about 1.3 L/minute, and a fluid velocity at the wafer surface of about 16 m/s to 31 m/s. The wafer substrate may then be rotated at a second rotation rate of about 20 rpm to 800 rpm, or about 25 rpm, while the wafer substrate is contacted with degassed pre-wetting fluid from about 1 second to 90 seconds, or about 20 seconds, at a flow rate of about 0.6 L/minute to 2.2 L/minute, or about 1.3 L/minute, and a fluid velocity at the wafer surface of about 16 m/s to 31 m/s. In some embodiments, this second rotation rate operation may not be included in the pre-wetting operation. The pre-wetting chamber may then be brought to atmospheric pressure, after which the wafer substrate may be rotated at 1 rpm to 250 rpm, or about 180 rpm. In some embodiments, the wafer substrate may not be rotated after the pre-wetting chamber is brought to atmospheric pressure.

In some embodiments, the pre-wetting fluid may be delivered to the wafer substrate in pulses. For example, the pre-wetting fluid may be on for about 1 second to 9 seconds, or about 5 seconds, and then off for 100 milliseconds to 900 milliseconds, or about 500 milliseconds. The pulses of pre-wetting fluid may be repeated about 5 to 15 times, or about 10 times, in some embodiments.

In some embodiments, deionized water may be used in the pre-wetting process for through resist plating. In some other embodiments, a chemical solution that aids in dislodging and removing photoresist particles from the wafer substrate may be used in the pre-wetting process for through resist plating.

Figure 11A:
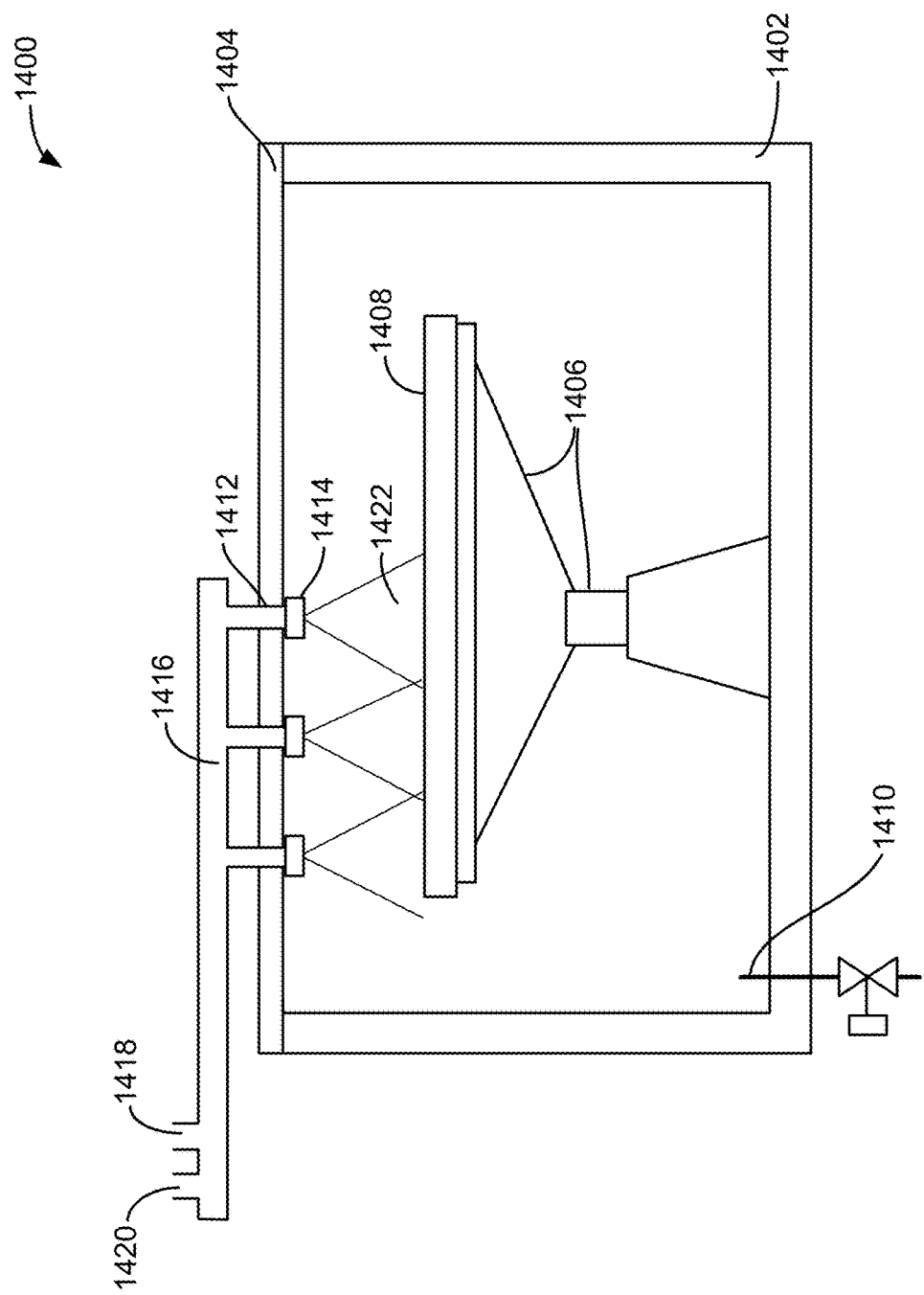
FIGS. 11a and 11b depict an embodiment of a pre-wetting chamber for through resist plating.
Figure 11B:
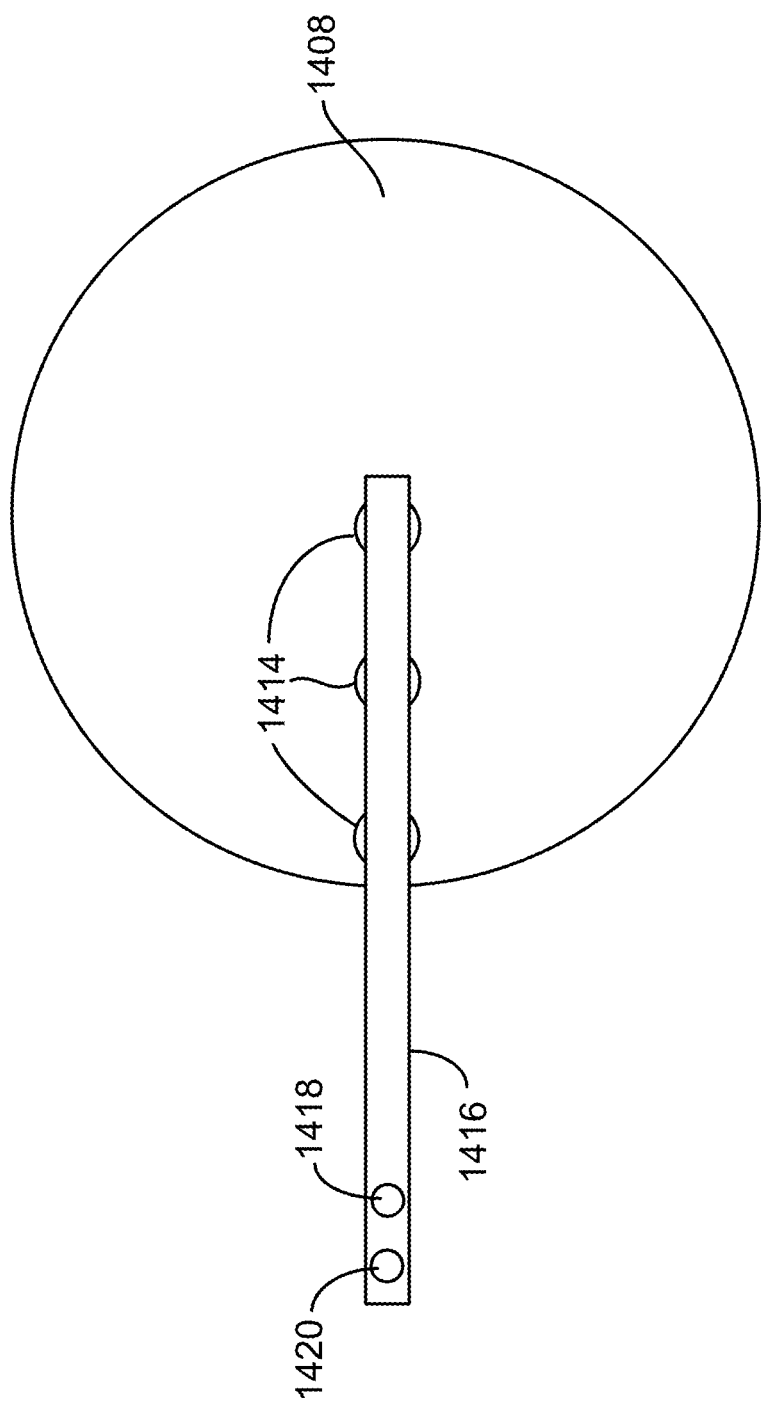

FIGS. 11a and 11b depict an embodiment of a pre-wetting chamber for through resist plating. FIG. 11a shows a cross-sectional view of the pre-wetting chamber, and FIG. 11b shows a top-down view of a fluid inlet manifold and a wafer substrate. A pre-wetting chamber 1400 includes a chamber body 1402 and a chamber cover 1404 that form a vacuum seal when in contact with one another. The chamber body 1402 supports a wafer substrate holder 1406 configured to hold a wafer substrate 1408 and configured to rotate the wafer substrate 1408. The chamber body 1402 further includes a vacuum port 1410. The vacuum port is coupled to a vacuum pump and configured to allow the formation of a subatmospheric pressure in the pre-wetting chamber 1400.

The chamber cover 1404 includes three fluid inlets 1412 coupled to a manifold 1416. The manifold 1416 may include one or more ports. As shown, the manifold 1416 includes a port 1418 that may be coupled to a degasser (not shown) for admitting a pre-wetting fluid to the pre-wetting chamber 1400. A port 1420 of the manifold 1416 may be used to purge the manifold 1416 with an inert gas to remove any pre-wetting fluid that may remain in the manifold 1416 after a pre-wetting process.

In certain embodiments, each of the fluid inlets 1412 is configured to deliver the degassed pre-wetting fluid onto the wafer substrate at a velocity of at least about 7 meters per second (m/s) to dislodge photoresist particles from the surface of the wafer substrate. Further, in certain embodiments, the fluid inlets together are configured to deliver the degassed pre-wetting fluid onto the wafer substrate at a flow rate at least about 0.4 L/minute such that the dislodged photoresist particles are washed off of and removed from the wafer substrate.

In some embodiments, each of the fluid inlets 1412 includes a nozzle 1414. In some embodiments, each of the nozzles 1414 is a fan nozzle. The fan nozzles may be configured to deliver the degassed pre-wetting fluid onto the wafer substrate such that the degassed pre-wetting fluid impinges the wafer substrate in the shape of a line or rectangle. FIG. 11a shows a degassed pre-wetting fluid 1422 from the nozzles 1414 impinging the wafer substrate 1408. As also shown in FIG. 11a, the nozzles 1414 are configured such that the degassed pre-wetting fluid nozzles are distributed substantially across a radius of the wafer substrate; i.e., from an edge of the wafer substrate to about the center of the wafer substrate. In this configuration, the degassed pre-wetting fluid also contacts the wafer substrate substantially across the radius of the substrate. With the wafer substrate rotating, the entire wafer substrate surface may be contacted with the pre-wetting fluid after one complete rotation of the wafer substrate.

As mentioned, a fan nozzle is a type of fluid nozzle that allows a fluid flow to spread out from the nozzle in the shape of a fan. In a specific example, for pre-wetting a 300 millimeter diameter wafer substrate in the pre-wetting chamber 1400, the pre-wetting chamber may include three fan nozzles. Each of the fan nozzles may have a spray angle of about 20 degrees to 60 degrees, or about 40 degrees. Each of the fan nozzles for use with the pre-wetting chamber 1400 may have an orifice size of 0.02 inches to 0.05 inches, or about 0.035 inches, a flow rate of about 0.15 L/minute to 1 L/minute, or about 0.25 L/minute, with a pressure of the nozzle being about 30 psi to 80 psi, or about 40 psi, and a fluid velocity at the wafer surface of about 7 m/s to 31 m/s. Three nozzles, each having a flow rate of about 0.25 L/minute, may deliver a pre-wetting fluid at a total flow rate of about 0.75 L/minute. In some embodiments, the fan of pre-wetting fluid delivered from a nozzle is substantially flat.

In a pre-wetting operation using the pre-wetting chamber 1400, a wafer substrate may be placed in the pre-wetting chamber and the chamber closed. A vacuum of about 50 Torr to 100 Torr, or about 70 Torr, may be formed in the pre-wetting chamber. The wafer substrate may be rotated at a first rotation rate of about 20 rpm to 800 rpm, or about 80 rpm, while the wafer substrate is contacted with degassed pre-wetting fluid from about 5 seconds to 90 seconds, or about 10 seconds, at a total flow rate of about 0.45 L/minute to 3 L/minute, or about 0.75 L/minute, and a fluid velocity at the wafer surface of about 7 m/s to 31 m/s. The wafer substrate may then be rotated at a second rotation rate of about 20 rpm to 800 rpm, or about 25 rpm, while the wafer substrate is contacted with degassed pre-wetting fluid from about 1 second to 90 seconds, or about 20 seconds, at a total flow rate of about 0.45 L/minute to 3 L/minute, or about 0.75 L/minute, and a fluid velocity at the wafer surface of about 7 m/s to 31 m/s. In some embodiments, this second rotation rate operation may not be included in the pre-wetting operation. The pre-wetting chamber may then be brought to atmospheric pressure, after which the wafer substrate may be rotated at 1 rpm to 250 rpm, or about 180 rpm. In some embodiments, the wafer substrate may not be rotated after the pre-wetting chamber is brought to atmospheric pressure.

In some embodiments, the pre-wetting fluid may be delivered to the wafer substrate in pulses. For example, the pre-wetting fluid may be on for about 1 second to 9 seconds, or about 5 seconds, and then off for 100 milliseconds to 900 milliseconds, or about 500 milliseconds. The pulses of pre-wetting fluid may be repeated about 5 to 15 times, or about 10 times, in some embodiments.

Figure 12:
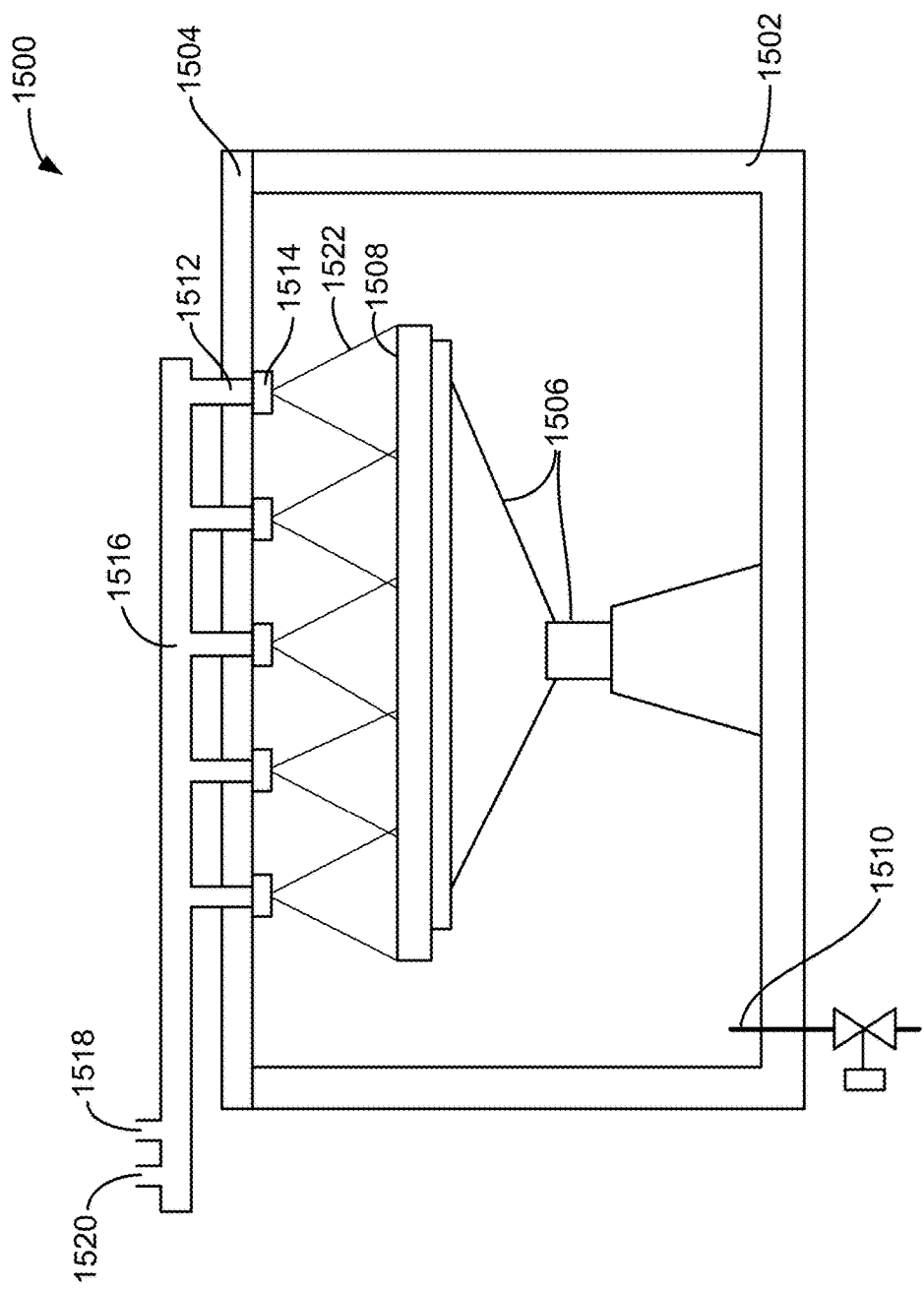
FIG. 12 depicts an embodiment of a pre-wetting chamber for through resist plating.

FIG. 12 depicts an embodiment of a pre-wetting chamber for through resist plating. A pre-wetting chamber 1500 may be similar to the pre-wetting chamber 1400, with one exception being that the pre-wetting chamber 1500 may include more fluid inlets. Further, degassed pre-wetting fluid may impinge the wafer substrate across the diameter of the wafer substrate in the pre-wetting chamber 1500.

A pre-wetting chamber 1500 includes a chamber body 1502 and a chamber cover 1504 that form a vacuum seal when in contact with one another. The chamber body 1502 includes a wafer substrate holder 1506 configured to hold a wafer substrate 1508 and configured to rotate the wafer substrate 1508. The chamber body 1502 further includes a vacuum port 1510. The vacuum port is coupled to a vacuum pump and configured to allow the formation of a subatmospheric pressure in the pre-wetting chamber 1500.

The chamber cover 1504 includes five fluid inlets 1512 coupled to a manifold 1516. The manifold 1516 may include one or more ports. As shown, the manifold 1516 includes a port 1518 that may be coupled to a degasser (not shown) for admitting a pre-wetting fluid to the pre-wetting chamber 1500. A port 1520 of the manifold 1516 may be used to purge the manifold 1516 with an inert gas to remove any pre-wetting fluid that may remain in the manifold 1516 after a pre-wetting process.

Each of the fluid inlets 1512 is configured to deliver the degassed pre-wetting fluid onto the wafer substrate at a velocity sufficient to dislodge photoresist particles from the surface of the wafer substrate. The fluid inlets together are configured to deliver the degassed pre-wetting fluid onto the wafer substrate at a flow rate such that the dislodged photoresist particles are washed off of and removed from the wafer substrate.

As with the above-described embodiments, each of the fluid inlets 1512 may include a nozzle 1514. Further, as above, each of the nozzles 1514 may be a fan nozzle. FIG. 12 shows a degassed pre-wetting fluid 1522 from nozzles 1514 impinging the wafer substrate 1508. In the pre-wetting chamber 1500, the nozzles 1514 are configured such that the degassed pre-wetting fluid contacts the wafer substrate substantially across the diameter of the wafer substrate; i.e., from one edge of the wafer substrate, though about the center of the wafer substrate, to another edge of the wafer substrate. With the wafer substrate rotating, the entire wafer substrate surface may be contacted with pre-wetting fluid after one half of a complete rotation of the wafer substrate.

In some embodiments, the pre-wetting chamber 1500 shown in FIG. 12 may be better able to remove photoresist particles from a wafer substrate than the pre-wetting chamber 1400 shown in FIG. 11a. For example, when a photoresist particle is mobilized within a feature in the wafer substrate (e.g., the forces holding the photoresist particle are overcome) but not removed from the feature, it would take one full rotation of the wafer substrate in the pre-wetting chamber 1400 before the degassed pre-wetting fluid possibly removes the photoresist particle from the feature. In the case of the pre-wetting chamber 1500, it would take one half of a full rotation of the wafer substrate before the degassed pre-wetting fluid possibly removes the photoresist particle from the feature In some embodiments of the pre-wetting chambers 1400 and 1500 shown in FIGS. 11a and 12, respectively, the chamber cover may remain stationary and loading/unloading wafer substrates from the pre-wetting chamber may be performed by the chamber body moving in a substantially vertical manner. The chamber cover remaining stationary may aid in preventing droplets of pre-wetting fluid from dropping onto the wafer substrate when it is being loaded into the pre-wetting chamber. A droplet of pre-wetting fluid contacting the wafer substrate, when the wafer substrate is not under vacuum, may trap air bubbles between the wafer substrate and the droplet of pre-wetting fluid. A port of the manifold of the pre-wetting chamber cover may be used to purge the manifold with an inert gas to remove any pre-wetting fluid that may remain in the manifold before loading a wafer substrate in the pre-wetting chamber. This also may aid in preventing droplets of pre-wetting fluid from dropping onto the wafer substrate.

The velocity and the force of the pre-wetting fluid contacting the wafer substrate in the pre-wetting chambers 1400 and 1500 shown in FIGS. 11a and 12, respectively, generally has a larger ratio of perpendicular to parallel components (from the perspective of the wafer surface) as compared to the pre-wetting chamber 1350 shown in FIG. 10a. For example, the angle of fluid impact relative to the plane of the substrate surface of the pre-wetting fluid in the pre-wetting chambers 1400 and 1500 is about 90 degrees, with a range of about 60 degrees to 90 degrees. The angle of incidence of the pre-wetting fluid in the pre-wetting chamber 1350 is about 6 degrees, with a range of about 3 degrees to 10 degrees. While the velocity of the pre-wetting fluid both perpendicular to and parallel to the wafer substrate surface may dislodge and remove photoresist particles from the wafer substrate, a large velocity perpendicular to the surface of the wafer substrate is believed to be better able to dislodge photoresist particles. Thus, the pre-wetting fluid velocity in the pre-wetting chambers 1400 and 1500, having a component of velocity primarily perpendicular to the wafer substrate, may not be as high as the pre-wetting fluid velocity in the pre-wetting chamber 1350, which has components of velocity perpendicular to and parallel to the wafer substrate.

While the pre-wetting chamber 1400 is shown as including three fluid inlets and three nozzles and the pre-wetting chamber 1500 is shown an including five fluid inlets and five nozzles, a pre-wetting chamber may include one to eight (or even more in some embodiments) fluid inlets and associated nozzles. Further, a pre-wetting process using the pre-wetting chamber 1400 or the pre-wetting chamber 1500 may be similar to the pre-wetting process using the pre-wetting chamber 1350, described above. Yet further, while fan nozzles were described in the embodiments of the pre-wetting chambers 1350, 1400, and 1500, nozzles that produce a cone shaped fluid stream or other shaped fluid stream may be used.

In some embodiments, before performing a pre-wetting process on a wafer substrate for through resist plating, the wafer substrate may be passed though ionizer bars on an ionization system to aid in removal of photoresist particles from the wafer substrate. Such ionization systems work by increasing the conductivity of the air with ionized gas molecules. When ionized air comes in contact with a charged surface, such as photoresist particles that may be bound to the wafer substrate by electrostatic forces, the surface attracts ions of the opposite polarity. As a result, the static electricity is neutralized and the photoresist particles may be more easily removed from the wafer substrate during a pre-wetting process.

In some embodiments, a pre-wetting process on a wafer substrate for through resist plating may be performed using a pre-wetting chamber without any specified pre-wetting fluid velocity or flow rate. In such embodiments, it may be desirable to employ an additional mechanism for dislodging particles. For example, the pre-wetting chamber may include a megasonic transducer that may be rotated over the wafer substrate surface and activated after a pre-wetting process in the pre-wetting chamber. A megasonic transducer may dislodge photoresist particles from a wafer substrate. Alternatively, a megasonic transducer may be incorporated in any of the pre-wetting chambers disclosed herein to aid in removing particles from a wafer substrate. In some embodiments, the pre-wetting process with a megasonic transducer may be performed under vacuum with degassed deionized water.

The through resist plating pre-wetting apparatus described herein may include hardware for accomplishing the process operations, as described above, and also include a system controller (not shown) having instructions for controlling process operations in accordance with the disclosed implementations. The system controller may include one or more memory devices and one or more processors configured to execute the instructions so that the apparatus can perform a method in accordance with the disclosed implementations. Such instructions may include, for example, evacuating the pre-wetting chamber, rotating the wafer at one or more speeds, flowing degassed pre-wetting fluid through the manifold into the chamber for specified durations and during specified rotation rates of the wafer substrate, stopping the flow of degassed fluid, stopping or slowing rotation of the wafer substrate, pressurizing the chamber, and removing the wafer substrate. Any combination of the above operations may be programmed via appropriate instructions. Machine-readable media containing instructions for controlling process operations in accordance with the disclosed implementations may be coupled to the system controller.

Figure 13:
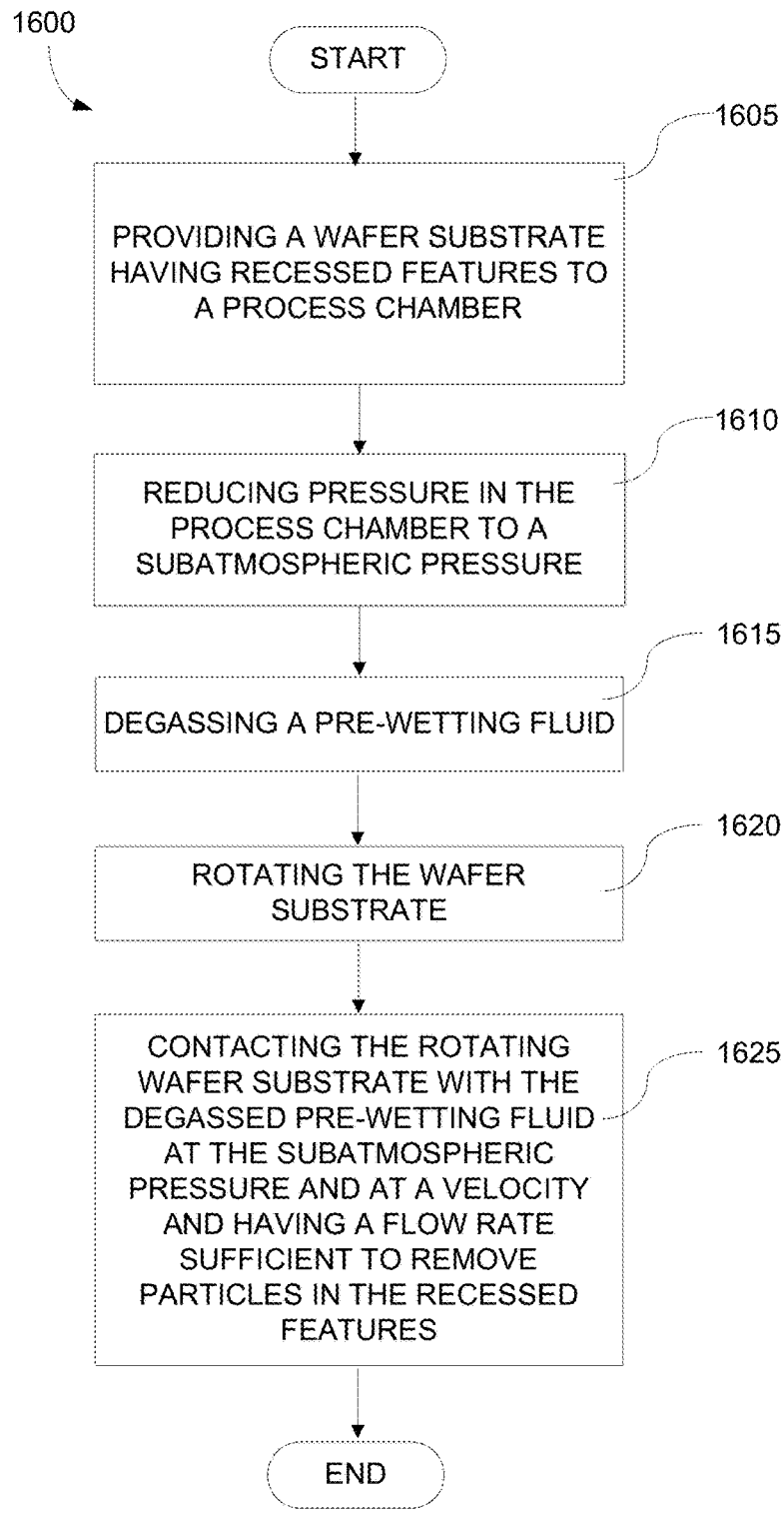
FIG. 13 is a flow diagram for an embodiment of a pre-wetting process for through resist plating.

FIG. 13 is a flow diagram for an embodiment of a pre-wetting process (1600) for through resist plating. A wafer substrate having recessed features such as openings in a resist layer is provided to a pre-wetting process chamber (1605) such as chamber 1350, 1400, or 1500. In the case of through resist plating, the bottoms of the recessed features contain metal onto which additional metal will be plated after pre-wetting. In the process chamber, the wafer substrate is loaded onto a wafer support or chuck such as feature 1356, 1406, or 1506. After the wafer substrate is appropriately located in the process chamber for pre-wetting, the pressure in the process chamber is then reduced to a subatmospheric pressure (1610). Separately, a pre-wetting fluid is degassed (1615). Consistent with certain embodiments described above, the fluid may be degassed in a separate degassing element. The degassing may be performed concurrently with other operations depicted in FIG. 13. When the wafer substrate is appropriately installed in the process chamber it is rotated (1620). In certain embodiments, the rotation begins prior to or during reduction of the chamber pressure (1610) and/or degassing of the fluid (1615). After the pressure in the chamber is reduced to the desired level, the wafer substrate is contacted with the degassed pre-wetting fluid at a subatmospheric pressure while the wafer substrate is rotating. This forms a wetting layer on the wafer substrate surface (1625). In certain embodiments, the degassed pre-wetting fluid contacts the wafer substrate at a velocity sufficient to dislodge any particles on the exposed metal layer and at a flow rate sufficient to remove dislodged particles from the wafer substrate. In various examples, the linear velocity at which the fluid contacts the wafer substrate is at least about 5 m/s and the volumetric flow rate of the fluid on the wafer substrate is at least about 0.3 L/minute. In some embodiments, the pre-wetting fluid may be deionized water or a chemical solution that aids in dislodging and removing particles from the wafer substrate. Such a pre-wetting process can be performed in the pre-wetting apparatus designs described herein. Further, the pre-wetting apparatus and processes described herein may be used to remove any type of particle or debris from a wafer substrate.

The apparatus/methods described hereinabove may be used in conjunction with lithographic patterning tools or processes, for example, for the fabrication or manufacture of semiconductor devices, displays, LEDs, photovoltaic panels and the like. Generally, though not necessarily, such tools/processes will be used or conducted together in a common fabrication facility. Lithographic patterning of a film generally comprises some or all of the following steps, each step enabled with a number of possible tools: (1) application of photoresist on a work piece, i.e., a substrate, using a spin-on or spray-on tool; (2) curing of photoresist using a hot plate or furnace or UV curing tool; (3) exposing the photoresist to visible, UV, or x-ray light with a tool such as a wafer stepper; (4) developing the resist so as to selectively remove resist and thereby pattern it using a tool such as a wet bench; (5) transferring the resist pattern into an underlying film or work piece by using a dry or plasma-assisted etching tool; and (6) removing the resist using a tool such as an RF or microwave plasma resist stripper.

Although the foregoing apparatus designs and methods have been described in some detail for purposes of clarity of understanding, it will be apparent that certain changes and modifications may be practiced within the scope of the appended claims. It should be noted that there are many alternative ways of implementing both the process and compositions described herein. Accordingly, the present embodiments are to be considered as illustrative and not restrictive, and embodiments are not to be limited to the details given herein.

What is claimed is:
1. A method comprising:
(a) providing a wafer substrate having an exposed metal layer on at least a portion of a surface of the wafer substrate to a process chamber, wherein the process chamber comprises a liquid inlet, the liquid inlet including at least one nozzle configured to deliver a pre-wetting liquid onto the wafer substrate;
(b) reducing pressure in the process chamber to a subatmospheric pressure using a vacuum port in the process chamber;

(c) degassing the pre-wetting liquid to remove one or more dissolved gasses from the pre-wetting liquid using a degasser coupled to the liquid inlet;

(d) contacting the wafer substrate with the degassed pre-wetting liquid at the subatmospheric pressure in the process chamber and thereby forming a wetting layer on the wafer substrate, held by a wafer holder in the process chamber, wherein the degassed pre-wetting liquid is delivered from the one or more nozzles onto the wafer substrate at a velocity of at least about 7 meters per second and is admitted through the liquid inlet to the process chamber at a flow rate of at least about 0.4 liters per minute.

2. The method of claim 1, wherein (d) comprises dislodging and removing particulate material from the wafer substrate.

3. The method of claim 1, further comprising rotating the wafer substrate while the degassed pre-wetting liquid is delivered onto the wafer substrate.

4. The method of claim 1, wherein the at least one nozzle includes a fan nozzle and wherein the delivered degassed pre-wetting liquid impinges the wafer substrate in a shape of a line.

5. The method of claim 1, wherein the process chamber includes a cover and a body, wherein the method includes:
prior to forming the subatmospheric pressure in the process chamber, moving the body in a substantially vertical manner, while the cover remains stationary to bring the body into contact with the cover and to form a vacuum seal.

6. The method of claim 5, wherein the at least one nozzle is attached to the cover.

7. The method of claim 1, wherein (d) comprises delivering the degassed pre-wetting fluid onto the wafer substrate from an edge of the wafer substrate to substantially the center of the wafer substrate.

8. The method of claim 1, wherein (d) comprises holding the wafer substrate in a substantially face-up orientation.

9. The method of claim 1, wherein the degasser is a membrane contactor degasser.

10. The method of claim 1, wherein the degassed pre-wetting liquid has about 0.5 ppm or less dissolved atmospheric gas.

11. The method of claim 1, wherein the pre-wetting liquid is selected from the group consisting of deionized water and a chemical solution that aids in dislodging and removing particles from the wafer substrate.

12. The method of claim 1, wherein the vacuum port is located below the wafer holder.

13. The method of claim 1, wherein (d) comprises maintaining the subatmospheric pressure of less than about 50 Torr during formation of the wetting layer on the wafer substrate.

14. The method of claim 1, further comprising:
(e) after forming the wetting layer on the wafer substrate, stopping delivery of the degassed pre-wetting liquid, and
(f) after stopping the delivery of the degassed pre-wetting liquid, rotating the wafer substrate to remove excess surface entrained degassed pre-wetting liquid from the wafer substrate.

15. The method of claim 14, further comprising: increasing pressure in the process chamber to atmospheric pressure or to above atmospheric pressure after stopping the delivery of the degassed pre-wetting liquid and prior to removal of the excess surface entrained pre-wetting liquid.

16. The method of claim 1, wherein the wafer substrate comprises a plurality of recessed features formed in a photoresist, and wherein (d) removes photoresist particles from the plurality of recesses.

17. The method of claim 1, wherein the wafer substrate comprises a plurality of recessed features formed in a photoresist, wherein the recessed features in the photoresist have openings having a size of about 5-200 micrometers.

18. The method of claim 1, wherein (d) is initiated after the pressure in the process chamber is reduced to 50 torr or less.

19. The method of claim 1, wherein (d) comprises contacting the wafer substrate with the degassed pre-wetting liquid for about 10 seconds to 120 seconds.

20. The method of claim 1, further comprising:
applying photoresist to the wafer substrate;
exposing the photoresist to light;
patterning the photoresist and transferring the pattern to the wafer substrate; and
selectively removing the photoresist from the wafer substrate.

* * * * *